US007161359B2

(12) United States Patent

Denen et al.

(10) Patent No.: US 7,161,359 B2

(45) Date of Patent: Jan. 9, 2007

(54) PAPER DISPENSER WITH PROXIMITY DETECTOR

(75) Inventors: Dennis Joseph Denen, Westerville, OH (US); Gary Edwin Myers, Westerville, OH (US); Charles W. Groezinger, Columbus, OH (US); John J. Knittle, Westerville, OH (US)

(73) Assignee: Georgia-Pacific Corporation, Atlanta, GA (US)

( * ) Notice: Subject to any disclaimer, the term of this patent is extended or adjusted under 35 U.S.C. 154(b) by 0 days.

(21) Appl. No.: 10/938,927

(22) Filed: Sep. 9, 2004

(65) Prior Publication Data

US 2005/0072874 A1 Apr. 7, 2005

Related U.S. Application Data

(60) Division of application No. 09/966,275, filed on Sep. 27, 2001, now Pat. No. 6,838,887, which is a continuation-in-part of application No. 09/780,733, filed on Feb. 9, 2001, now Pat. No. 6,592,067.

(51) Int. Cl.
*G01R 27/26* (2006.01)

(52) U.S. Cl. .................................... 324/686; 324/662

(58) Field of Classification Search ................ 324/686, 324/662

See application file for complete search history.

(56) References Cited

U.S. PATENT DOCUMENTS

| | | | |
|---|---|---|---|
| 2,193,759 | A | 3/1940 | Birr |
| 2,839,345 | A | 6/1958 | Engel et al. |
| 2,859,814 | A | 11/1958 | Berney |
| 2,930,663 | A | 3/1960 | Weiss |
| 3,007,650 | A | 11/1961 | Burton |
| 3,269,592 | A | 8/1966 | Slye |
| 3,288,387 | A | 11/1966 | Craven, Jr. |
| 3,384,280 | A | 5/1968 | Summersby |
| 3,628,743 | A | 12/1971 | Bastian |
| 3,635,417 | A | 1/1972 | Kajiwara et al. |
| 3,636,408 | A | 1/1972 | Shuman |
| 3,730,409 | A | 5/1973 | Ratti |
| 3,743,865 | A | 7/1973 | Riechmann |
| 3,850,356 | A | 11/1974 | Abe et al. |
| 3,858,951 | A | 1/1975 | Rasmussen |
| 3,917,191 | A | 11/1975 | Graham, Jr. et al. |
| 4,099,118 | A | 7/1978 | Franklin et al. |
| 4,106,684 | A | 8/1978 | Hartbauer et al. |
| 4,148,442 | A | 4/1979 | Baumann et al. |
| 4,159,807 | A | 7/1979 | Honsel et al. |
| 4,165,138 | A | 8/1979 | Hedge et al. |

(Continued)

FOREIGN PATENT DOCUMENTS

| | | |
|---|---|---|
| DE | 3342921 A1 | 6/1985 |

(Continued)

*Primary Examiner*—Anjan Deb
*Assistant Examiner*—Timothy J. Dole
(74) *Attorney, Agent, or Firm*—Fulbright & Jaworski L.L.P.

(57) ABSTRACT

A paper dispenser having a proximity detector for dispensation of paper therefrom. The dispenser includes a housing having an inner chamber adapted to support a roll of paper. The housing also has a dispensing aperture. A motor is adapted to dispense paper from the roll through the dispensing aperture. The dispenser also includes a proximity detection circuit, which comprises an antenna, an oscillator circuit to charge the antenna, an operational amplifier operated as a unity gain follower which receives an antenna signal from the antenna, a detector circuit which detects changes in the antenna signal, and a comparator which actuates the motor in response to changes in the antenna signal.

33 Claims, 20 Drawing Sheets

U.S. PATENT DOCUMENTS

| | | | |
|---|---|---|---|
| 4,267,752 | A | 5/1981 | Byrt et al. |
| 4,358,169 | A | 11/1982 | Filipowicz et al. |
| 4,378,912 | A | 4/1983 | Perrin et al. |
| 4,464,622 | A | 8/1984 | Franklin |
| 4,552,315 | A | 11/1985 | Granger |
| 4,569,467 | A | 2/1986 | Kaminstein |
| 4,611,768 | A | 9/1986 | Voss et al. |
| 4,666,099 | A | 5/1987 | Hoffman et al. |
| 4,712,461 | A | 12/1987 | Rasmussen |
| 4,721,265 | A | 1/1988 | Hawkins |
| 4,738,176 | A | 4/1988 | Cassia |
| 4,741,340 | A | 5/1988 | Batina et al. |
| 4,756,485 | A | 7/1988 | Bastian et al. |
| 4,786,005 | A | 11/1988 | Hoffman et al. |
| 4,790,490 | A | 12/1988 | Chakravorty |
| 4,796,825 | A | 1/1989 | Hawkins |
| 4,807,824 | A | 2/1989 | Gains et al. |
| 4,823,663 | A | 4/1989 | Hamlin |
| 4,826,262 | A | 5/1989 | Hartman et al. |
| 4,831,488 | A | 5/1989 | Playe |
| 4,846,412 | A | 7/1989 | Morand |
| 4,960,248 | A | 10/1990 | Bauer et al. |
| 4,992,907 | A | 2/1991 | Shreeve et al. |
| 5,031,258 | A | 7/1991 | Shaw |
| 5,148,126 | A | 9/1992 | Spencer |
| 5,205,454 | A | 4/1993 | Schutz et al. |
| 5,217,035 | A | 6/1993 | Van Marcke |
| 5,235,882 | A | 8/1993 | Rabourn |
| 5,244,161 | A | 9/1993 | Wirtz-Odenthal |
| 5,257,711 | A | 11/1993 | Wirtz-Odenthal |
| 5,271,574 | A | 12/1993 | Formon et al. |
| 5,294,192 | A | 3/1994 | Omdoll et al. |
| 5,299,407 | A | 4/1994 | Schuttler et al. |
| 5,302,167 | A | 4/1994 | Kley et al. |
| 5,335,811 | A | 8/1994 | Morand |
| 5,365,783 | A | 11/1994 | Zweifel |
| 5,400,982 | A | 3/1995 | Collins |
| 5,452,832 | A | 9/1995 | Niada |
| 5,505,129 | A | 4/1996 | Greb et al. |
| 5,511,743 | A | 4/1996 | Kozlowsky et al. |
| 5,526,973 | A | 6/1996 | Boone et al. |
| 5,538,587 | A | 7/1996 | Sakano et al. |
| 5,553,522 | A | 9/1996 | Boldrini et al. |
| 5,558,302 | A | 9/1996 | Jesperson |
| 5,604,992 | A | 2/1997 | Robinson |
| 5,625,327 | A | 4/1997 | Carroll et al. |
| 5,630,526 | A | 5/1997 | Moody |
| 5,670,886 | A | 9/1997 | Wolff et al. |
| 5,694,653 | A | 12/1997 | Harald |
| 5,704,566 | A | 1/1998 | Schutz et al. |
| 5,730,165 | A | 3/1998 | Philipp |
| 5,772,291 | A | 6/1998 | Byrd et al. |
| 5,806,203 | A | 9/1998 | Robinson |
| 5,823,083 | A | 10/1998 | Obertegger et al. |
| 5,833,413 | A | 11/1998 | Cornelius |
| 5,860,344 | A | 1/1999 | Yamamoto et al. |
| 5,868,343 | A | 2/1999 | Granger |
| 5,899,406 | A | 5/1999 | Payne |
| 5,915,645 | A | 6/1999 | Granger |
| 5,950,898 | A | 9/1999 | Menna |
| 5,974,764 | A | 11/1999 | Anstey et al. |
| 5,979,822 | A | 11/1999 | Morand et al. |
| 5,986,549 | A | 11/1999 | Teodorescu |
| 6,032,898 | A | 3/2000 | LaCount et al. |
| 6,067,673 | A | 5/2000 | Paese et al. |
| 6,069,354 | A | 5/2000 | Alfano et al. |
| 6,105,898 | A | 8/2000 | Byrd et al. |
| 6,118,469 | A | 9/2000 | Hosomi |
| 6,145,779 | A | 11/2000 | Johnson et al. |
| 6,152,397 | A | 11/2000 | Purcell |
| 6,198,271 | B1 | 3/2001 | Heger et al. |
| 6,279,777 | B1 | 8/2001 | Goodin et al. |
| 6,293,486 | B1 | 9/2001 | Byrd et al. |
| 6,354,533 | B1 | 3/2002 | Jespersen |
| 6,363,824 | B1 | 4/2002 | Granger |
| 6,412,679 | B1 | 7/2002 | Formon et al. |
| 6,419,136 | B1 | 7/2002 | Formon et al. |
| 6,486,680 | B1 | 11/2002 | Mull |

FOREIGN PATENT DOCUMENTS

| | | | |
|---|---|---|---|
| EP | 0 459 050 | A1 | 12/1991 |
| FR | 2539293 | | 7/1984 |
| FR | 2583729 | A1 | 12/1986 |
| FR | 2771620 | A1 | 6/1999 |
| GB | 2058014 | | 4/1981 |
| GB | 2267271 | A | 12/1993 |

PAPER DISPENSER WITH PROXIMITY DETECTOR

PRIORITY

This application is a divisional of U.S. patent application Ser. No. 09/966,275, filed on Sep. 27, 2001, now U.S. Pat. No. 8,838,887, which is a continuation-in-part of U.S. patent application Ser. No. 09/780,733, filed Feb. 9, 2001, now U.S. Pat. No. 6,592,067. The disclosures of each of the aforementioned documents is incorporated herein by reference.

BACKGROUND OF THE INVENTION

1. Field of the Invention

This invention relates to the field of paper roll dispensers. In particular it relates to a carousel dispensing system for paper towels adapted to dispense paper from a plurality of rolls. This invention relates to the field of proximity sensors. In particular it relates to the field of phase-balance proximity sensors. It relates to spurious noise-immune proximity sensors.

2. Background

As is readily apparent, a long-standing problem is to keep paper towels available in a dispenser and at the same time use up each roll as completely as possible to avoid paper waste. As part of this system, one ought to keep in mind the person who refills the towel dispenser. An optimal solution would make it as easy as possible and as "fool-proof" as possible to operate the towel refill system and have it operate in such a manner as the least amount of waste of paper towel occurs. This waste may take the form of "stub" rolls of paper towel not being used up.

Transfer devices are used on some roll towel dispensers as a means of reducing waste and decreasing operating costs. These transfer devices work in a variety of ways. The more efficient of these devices automatically begin feeding from a reserve roll once the initial roll is exhausted. These devices eliminate the waste caused by a maintenance person when replacing small rolls with fresh rolls in an effort to prevent the dispenser from running out of paper. These transfer devices, however, tend to be difficult to load and/or to operate. Consequently, these transfer devices are less frequently used, even though they are present.

The current transfer bar mechanisms tend to require the maintenance person to remove any unwanted core tube(s), remove the initial partial roll from the reserve position, and position the initial partial roll into the now vacant stub roll position. This procedure is relatively long and difficult, partly because the stub roll positions in these current paper towel dispensers tend to be cramped and difficult to get to.

In order to keep a roll available in the dispenser, it is necessary to provide for a refill before the roll is used up. This factor generally requires that a "refill" be done before the current paper towel roll is used up. If the person refilling the dispenser comes too late, the paper towel roll will be used up. If the refill occurs too soon, the amount of paper towel in the almost used-up roll, the "stub" roll, will be wasted unless there is a method and a mechanism for using up the stub roll even though the dispenser has been refilled. Another issue exists, as to the ease in which the new refill roll is added to the paper towel dispenser. The goal is to bring "on-stream" the new refill roll as the last of the stub roll towel is being used up. If it is a task easily done by the person replenishing the dispensers, then a higher probability exists that the stub roll paper towel will actually be used up and also that a refill roll be placed into service before the stub roll has entirely been used up. It would be extremely desirable to have a paper towel dispenser which tended to minimize paper wastage by operating in a nearly "fool proof" manner with respect to refilling and using up the stub roll.

As an enhancement and further development of a system for delivering paper towel to the end user in as cost effective manner and in a user-friendly manner as possible, an automatic means for dispensing the paper towel is desirable, making it unnecessary for a user to physically touch a knob or a lever.

It has long been known that the insertion of an object with a dielectric constant into a volume with an electrostatic field will tend to modify the properties which the electrostatic field sees. For example, sometimes it is noticed that placing one hand near some radios will change the tuning of that radio. In these cases, the property of the hand, a dielectric constant close to that of water, is enough to alter the net capacitance of a tuned circuit within the radio, where that circuit affects the tuning of the RF signal being demodulated by that radio. In 1973 Riechmann (U.S. Pat. No. 3,743,865) described a circuit which used two antenna structures to detect an intrusion in the effective space of the antennae. Frequency and amplitude of a relaxation oscillator were affected by affecting the value of its timing capacitor.

The capacity (C) is defined as the charge (Q) stored on separated conductors with a voltage (V) difference between the conductors:

$$C=Q/V.$$

For two infinite conductive planes with a charge per unit area of $\sigma$, a separation of d, with a dielectric constant $\epsilon$ of the material between the infinite conductors, the capacitance of an area A is given by:

$$C=\epsilon A\sigma/d$$

Thus, where part of the separating material has a dielectric constant $\epsilon_1$ and part of the material has the dielectric constant $\epsilon_2$, the net capacity is:

$$C=\epsilon_1 A_1\sigma/d+\epsilon_2 A_2\sigma/d$$

The human body is about 70% water. The dielectric constant of water is $7.18\times10^{-10}$ farads/meter compared to the dielectric constant of air (STP): $8.85\times10^{-12}$ farads/meter. The dielectric constant of water is over 80 times the dielectric constant of air. For a hand thrust into one part of space between the capacitor plates, occupying, for example, a hundredth of a detection region between large, but finite parallel conducting plates, a desirable detection ability in terms of the change in capacity is about $10^{-4}$. About $10^{-2}$ is contributed by the difference in the dielectric constants and about $10^{-32}$ is contributed by the "area" difference.

Besides Riechmann (1973), other circuits have been used for, or could be used for proximity sensing.

An important aspect of a proximity detector circuit of this type is that it be inexpensive, reliable, and easy to manufacture. A circuit made of a few parts tends to help with reliability, cost and ease of manufacture. Another desirable characteristic for electronic circuits of this type is that they have a high degree of noise immunity, i.e., they work well in an environment where there may be electromagnetic noise and interference. Consequently a more noise-immune circuit will perform better and it will have acceptable performance in more areas of application.

SUMMARY OF THE INVENTION

The present invention is directed toward a dispenser for paper towels. The dispenser comprises a housing, a motor, and a proximity detector. The housing has an inner chamber adapted to support a roll of paper. The housing also includes a dispensing aperture, and the motor is adapted to dispense paper from the roll of paper therethrough. The proximity detector comprises an antenna, an oscillator circuit which charges the antenna, an operational amplifier operated as a unity gain follower which receives an antenna signal from the antenna, a detector circuit which receives the antenna signal from the operational amplifier, detects chances in that signal, and generates a detection signal in response to those changes, and a comparator which actuates the motor in response to the detection signal.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

The following description is of the best mode presently contemplated for carrying out the invention. This description is not to be taken in a limiting sense, but is merely made for the purpose of describing the general principles of the invention. The scope of the invention should be determined with reference to the claims.

An embodiment of the invention comprises a carousel-based dispensing system with a transfer bar for paper towels, which acts to minimize actual wastage of paper towels. As an enhancement and further development of a system for delivering paper towel to the end user in a cost effective manner and in as user-friendly manner as possible, an automatic means for dispensing the paper towel is desirable, making it unnecessary for a user to physically touch a knob or a lever. An electronic proximity sensor is included as part of the paper towel dispenser. A person can approach the paper towel dispenser, extend his or her hand, and have the proximity sensor detect the presence of the hand. The embodiment of the invention as shown here, is a system, which advantageously uses a minimal number of parts for both the mechanical structure and for the electronic unit. It has, therefore, an enhanced reliability and maintainability, both of which contribute to cost effectiveness.

An embodiment of the invention comprises a carousel-based dispensing system with a transfer bar for paper towels, which acts to minimize actual wastage of paper towels. The transfer bar coupled with the carousel system is easy to load by a service person; consequently it will tend to be used, allowing stub rolls to be fully utilized. In summary, the carousel assembly-transfer bar comprises two components, a carousel assembly and a transfer bar. The carousel rotates a used-up stub roll to an up position where it can easily be replaced with a full roll. At the same time the former main roll which has been used up such that its diameter is less than some p inches, where p is a rational number, is rotated down into the stub roll position. The tail of the new main roll in the upper position is tucked under the "bar" part of the transfer bar. As the stub roll is used up, the transfer bar moves down under spring loading until the tail of the main roll is engaged between the feed roller and the nib roller. The carousel assembly is symmetrical about a horizontal axis. A locking bar is pulled out to unlock the carousel assembly and allow it-to rotate about its axis, and is then released under its spring loading to again lock the carousel assembly in place.

Figure 1:
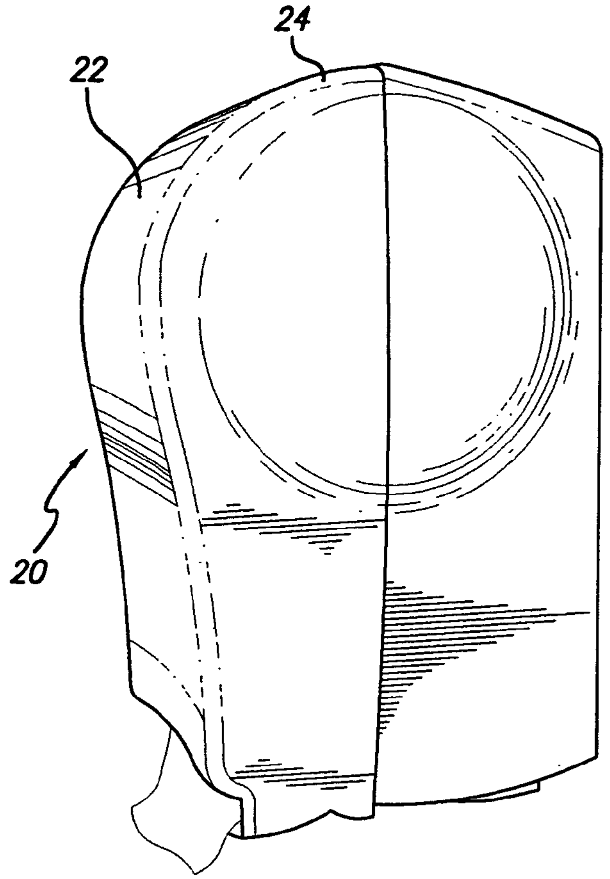
FIG. 1 is a side elevation of the dispenser with the cover closed, with no internal mechanisms visible.
Figure 2:
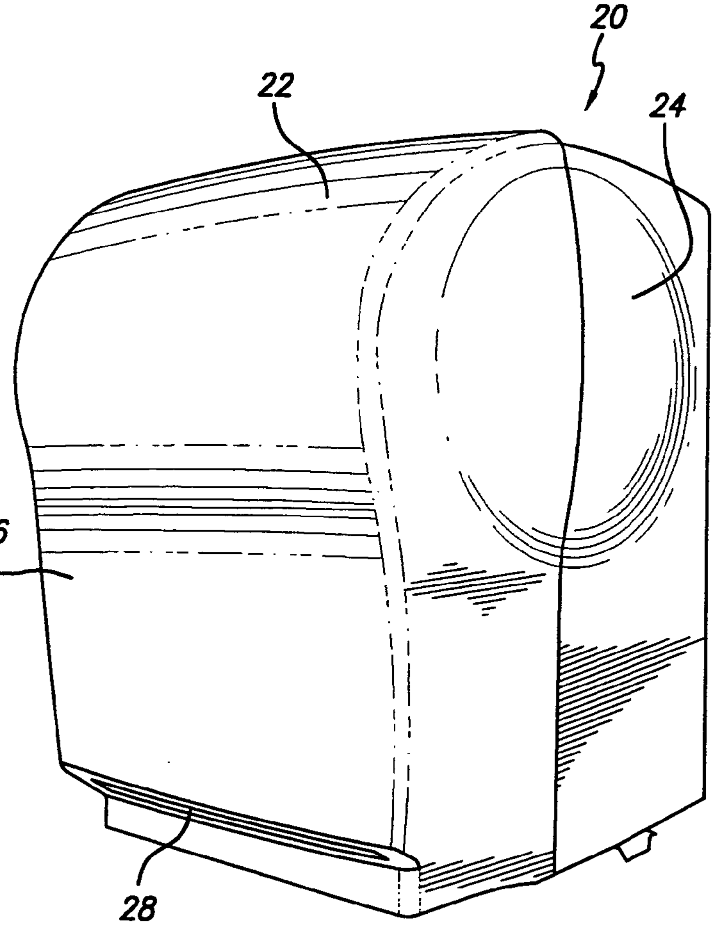
FIG. 2 is a perspective view of the dispenser with the cover closed, with no internal mechanisms visible.

A side view, FIG. 1, of the dispenser 20 with the cover 22 in place shows an upper circular bulge 24, providing room for a full roll of paper towel, installed in the upper position of the carousel. The shape of the dispenser is such that the front cover tapers inwardly towards the bottom to provide a smaller dispenser volume at the bottom where there is a smaller stub roll of paper towel. The shape tends to minimize the overall size of the dispenser. FIG. 2 shows a perspective view of the dispenser 20 with cover 22 in place and the circular (cylindrical) bulge 24, together with the sunrise-like setback 26 on the cover 22, which tends to visually guide a hand toward the pseudo-button 28, leading to activation of a proximity sensor (not shown). A light emitting diode (LED) 130 is located centrally to the pseudo-button 28. The LED 130 (FIG. 3) serves as an indication that the dispenser 20 is on, and dispensing towel. The LED 130 may be off while the dispenser is not dispensing. Alternatively, the LED 130 may be lit (on), and when the dispenser 20 is operating, the LED 130 might flash. The LED 130 might show green when the dispenser 20 is ready to dispense, and flashing green, or orange, when the dispenser 20 is operating to dispense. Any similar combination may be used. The least power consumption occurs when the LED 130 only lights during a dispensing duty cycle. The sunrise-like setback 26 (FIG. 2) allows a hand to come more closely to the proximity sensor (not shown).

Figure 3:
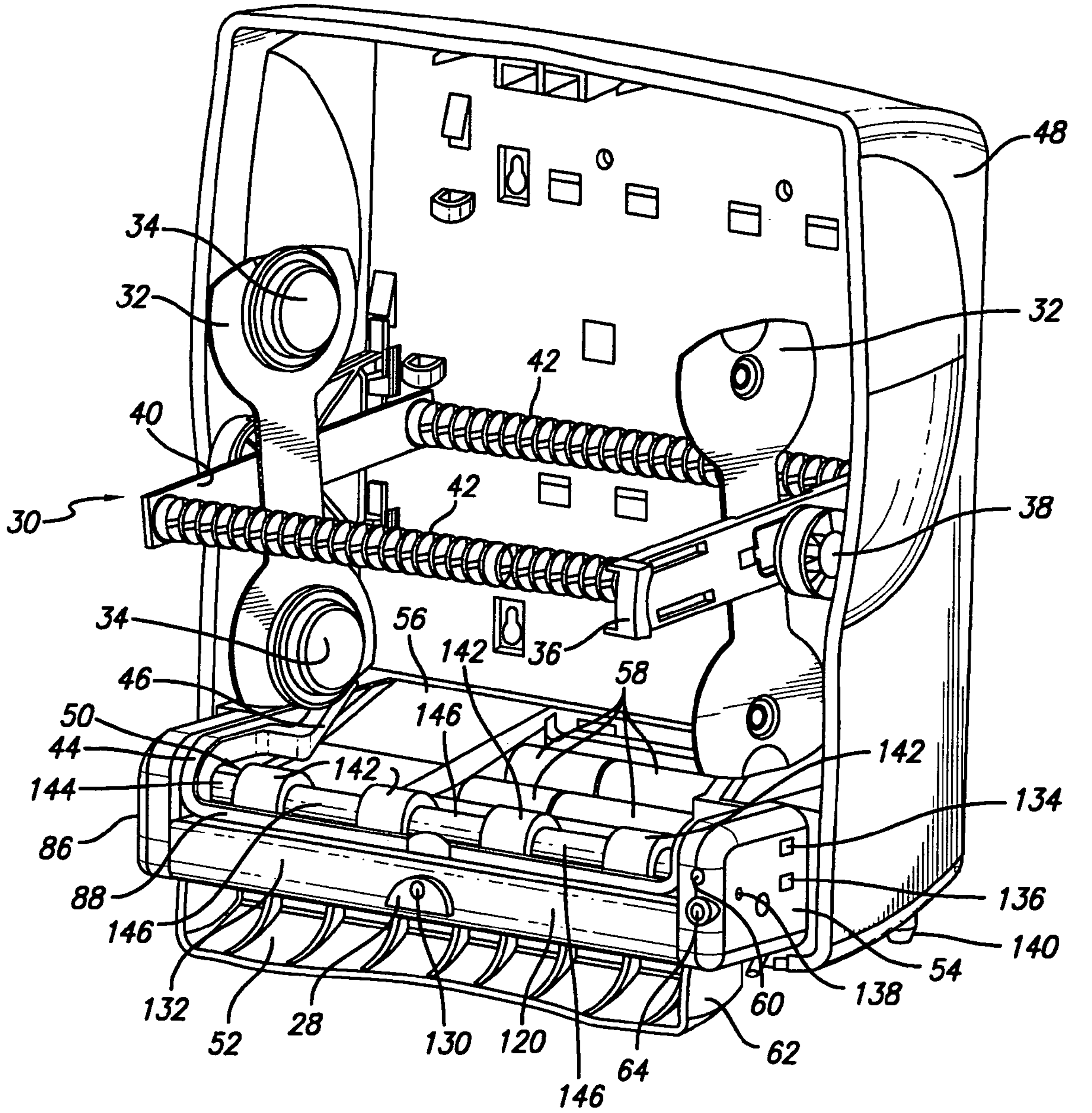
FIG. 3 shows a view of the carousel support, the locking bar and the transfer bar.

FIG. 3 shows the main elements of the carousel assembly 30. The carousel arms 32 have friction reducing rotating paper towel roll hubs 34, which are disposed into the holes of a paper towel roll (66, 68, FIG. 4A). The locking bar 36 serves to lock and to release the carousel for rotation about its axis 38. The locking bar 36 rides on one of the corresponding bars 40. The two corresponding bars 40 serve as support bars. Cross-members 42 serve as stiffeners for the carousel assembly 30, and also serve as paper guides for the paper to be drawn over and down to the feed roller 50 and out the dispenser 20. These cross members are attached in a rigid fashion to the corresponding bars 40 and in this embodiment do not rotate.

The legs 46 of the transfer bar 44 do not rest against the friction reducing rotating paper towel roll hubs 34 when there is no stub roll 68 present but are disposed inward of the roll hubs 34. The bar part 88 of the transfer bar 44 will rest against a structure of the dispenser, for example, the top of modular electronics unit 132, when no stub roll 68 is present. The bar part 88 of the transfer bar 44 acts to bring the tail of a new main roll of paper towel 66 (FIG. 4A) down to the feed roller 50 which includes intermediate bosses 146 (FIG. 3) and shaft 144. The carousel assembly is disposed within the fixed casing 48. The cover is not shown.

Feed roller 50 serves to feed the paper towels 66, 68 (FIG. 4A) being dispensed onto the curved dispensing ribs 52. The curved dispensing ribs 52 are curved and have a low area of contact with the paper towel dispensed (not shown). If the dispenser 20 gets wet, the curved dispensing ribs 52 help in dispensing the paper towel to get dispensed by providing low friction and by holding the dispensing towel off of the wet surfaces it would otherwise contact.

The feed roller 50 is typically as wide as the paper roll, and includes drive rollers 142 and intermediate bosses 146 on the drive shaft 144. The working drive rollers or drive bosses 142 (FIG. 3) are typically an inch or less in width, with intermediate bosses 146 (FIG. 3) located between them. Intermediate bosses 146 are slightly less in diameter than the drive rollers or drive bosses 142, having a diameter 0.015 to 0.045 inches less than the drive rollers or drive bosses 142. In this embodiment, the diameter of the intermediate bosses 146 is 0.030 inches less than the drive roller 142. This configuration of drive rollers or drive bosses 142 and intermediate bosses 146 tends to prevent the dispensing paper towel from becoming wrinkled as it passes through the drive mechanism and reduces friction, requiring less power to operate the feed roller 50.

A control unit 54 operates a motor 56. Batteries 58 supply power to the motor 56. A motor 56 may be positioned next to the batteries 58. A light 60, for example, a light-emitting diode (LED), may be incorporated into a low battery warning such that the light 60 turns on when the battery voltage is lower than a predetermined level.

The cover 22 of the dispenser is preferably transparent so that the amount of the main roll used (see below) may be inspected, but also so that the battery low light 60 may easily be seen. Otherwise an individual window on an opaque cover 22 would need to be provided to view the low battery light 60. Another approach might be to lead out the light by way of a fiber optic light pipe to a transparent window in the cover 22.

In a waterproof version of the dispenser, a thin piece of foam rubber rope is disposed within a u-shaped groove of the tongue-in-groove mating surfaces of the cover 22 and the casing 48. The dispensing shelf 62 is a modular component, which is removable from the dispenser 20. In the waterproof version of the dispenser 20, the dispensing shelf 62 with the molded turning ribs 52 is removed. By removing the modular component, dispensing shelf 62, there is less likelihood of water being diverted into the dispenser 20 by the dispensing shelf 62, acting as a funnel or chute should a water hose or spray be directed at the dispenser 20, by the shelf and wetting-the paper towel. The paper towel is dispensed straight downward. A most likely need for a waterproof version of the dispenser is where a dispenser is located in an area subject to being cleaned by being hosed down. The dispenser 20 has an on-off switch which goes to an off state when the cover 22 is pivoted downwardly. The actual switch is located on the lower face of the module 54 and is not shown.

In one embodiment, the user may actuate the dispensing of a paper towel by placing a hand in the dispenser's field of sensitivity. There can be adjustable delay lengths between activations of the sensor.

There is another aspect of the presence of water on or near the dispenser 20. A proximity sensor (not visible) is more fully discussed below, including the details of its operation. However, as can be appreciated, the sensor detects changes of capacitance such as are caused by the introduction of an object with a high dielectric constant relative to air, such as water, as well as a hand which is about 70% water. An on-off switch 140 is provided which may be turned off before hosing down and may be turned on manually, afterwards. The switch 140 may also work such that it turns itself back on after a period of time, automatically. The switch 140 may operate in both modes, according to mode(s) chosen by the user.

A separate "jog" off-on switch 64 is provided so that a maintenance person can thread the paper towel 66 by holding a spring loaded jog switch 64 which provides a temporary movement of the feed roller 50.

Figure 4A:
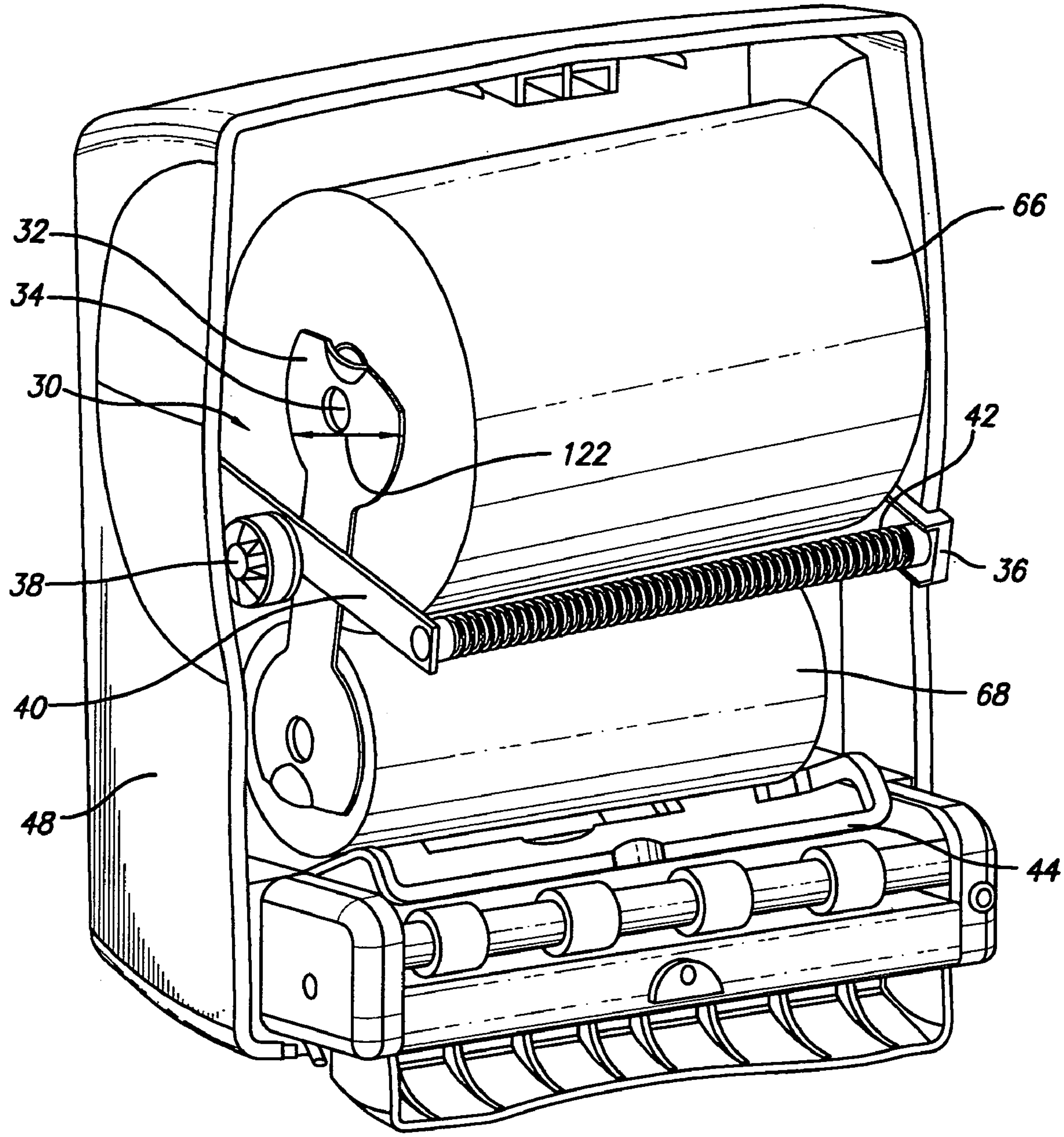
FIG. 4A is a perspective view of the of the dispenser with the carousel and transfer bar, fully loaded with a main roll and a stub roll.

FIG. 4A shows the dispenser case 48 with the carousel assembly 30 and transfer bar 44. The carousel assembly 30 is fully loaded with a main roll 66 and a stub roll 68, both mounted on the carousel arms 32 and rotate on the rotating reduced friction paper towel roll hubs 34 (only shown from the back of the carousel arms 32). In the carousel assembly 30, the two carousel arms 32, joined by corresponding bars 40 and cross members 42, rotate in carousel fashion about a horizontal axis defined by the carousel assembly rotation hubs 38. The locking bar 36 is supported, or carried, by a corresponding bar 40. The corresponding bar 40 provides structural rigidity and support. The locking bar 36 principally serves as a locking mechanism. Each paper towel roll 66, 68 has an inner cardboard tube which acts as a central winding core element, and which provides in a hole in paper towel roll 66, 68 at each end for engaging the hubs 34.

Figure 5:
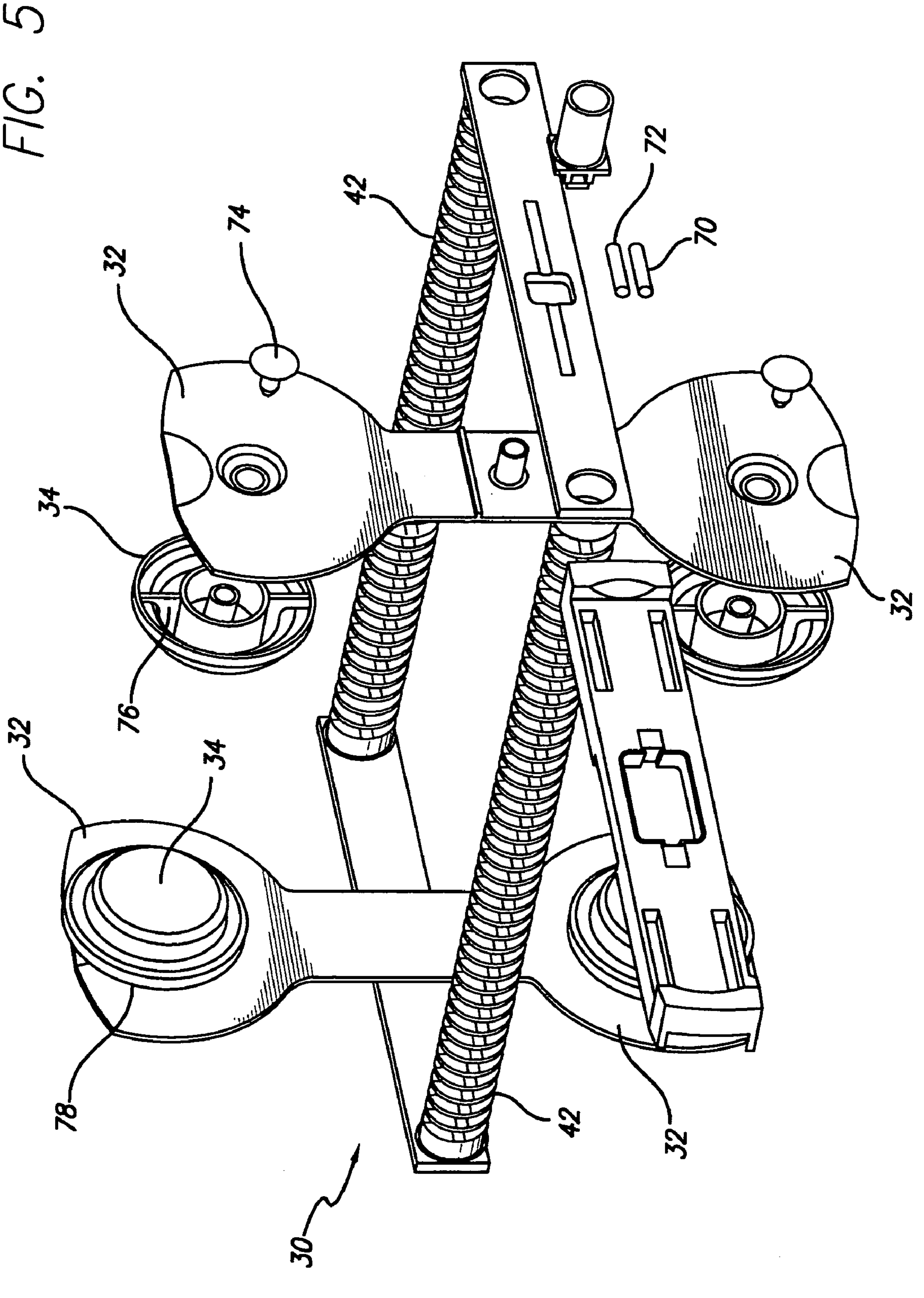
FIG. 5 is a perspective, exploded view of the carousel assembly.

FIG. 5 shows the carousel assembly 30 in exploded, perspective view. The number of parts comprising this assembly is small. From a reliability point of view, the reliability is increased. From a manufacturing point of view, the ease of manufacture is thereby increased and the cost of manufacture is reduced. The material of manufacture is not limited except as to the requirements of cost, ease of manufacture, reliability, strength and other requirements imposed by the maker, demand.

When the main roll, 66 (FIG. 4A) and the stub roll 68, (FIG. 4A) are in place, the carousel arms 32 are connected by these rolls 66 and 68 (FIG. 4A). Placing cross-members 42 to connect the carousel arms 32 with the locking 36 and corresponding 40 bar results in better structural stability, with racking prevented. The locking bar 36, which was shown as a single unit locking bar 36 in the previous figures, acts as a locking bar 36 to lock the carousel assembly 30 in the proper orientation. It acts also as the release bar, which when released, allows the carousel assembly 30 to rotate. Two compression springs 70, 72 are utilized to center the locking bar 36.

Figure 4B:
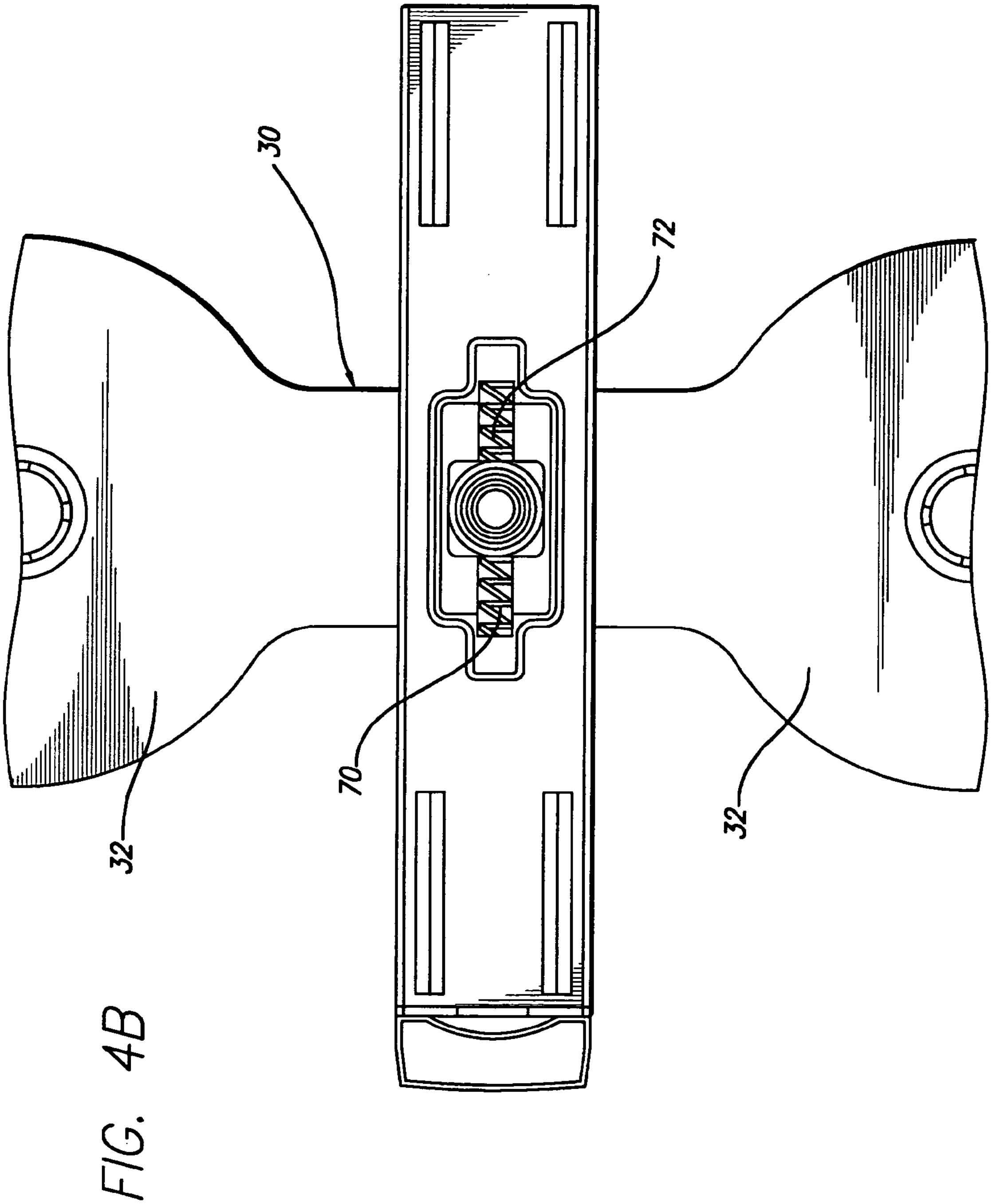
FIG. 4B is a side view of the locking bar showing the placement of the compression springs.

FIG. 4B is a side view of the locking bar showing the placement of the compression springs. The compression springs 70, 72 also tend to resist the release of the locking bar 36, insuring that a required force is needed to unlock the locking bar 36. The required force is typically between 0.5 lbf and 3.0 lbf, or more. In this embodiment, the force is 2.0 lbf when the spring is in a fully compressed position, and 1.1 lbf when the spring is in the rest position. In the rest position, the forces of the opposing springs offset each other.

Figure 4C:
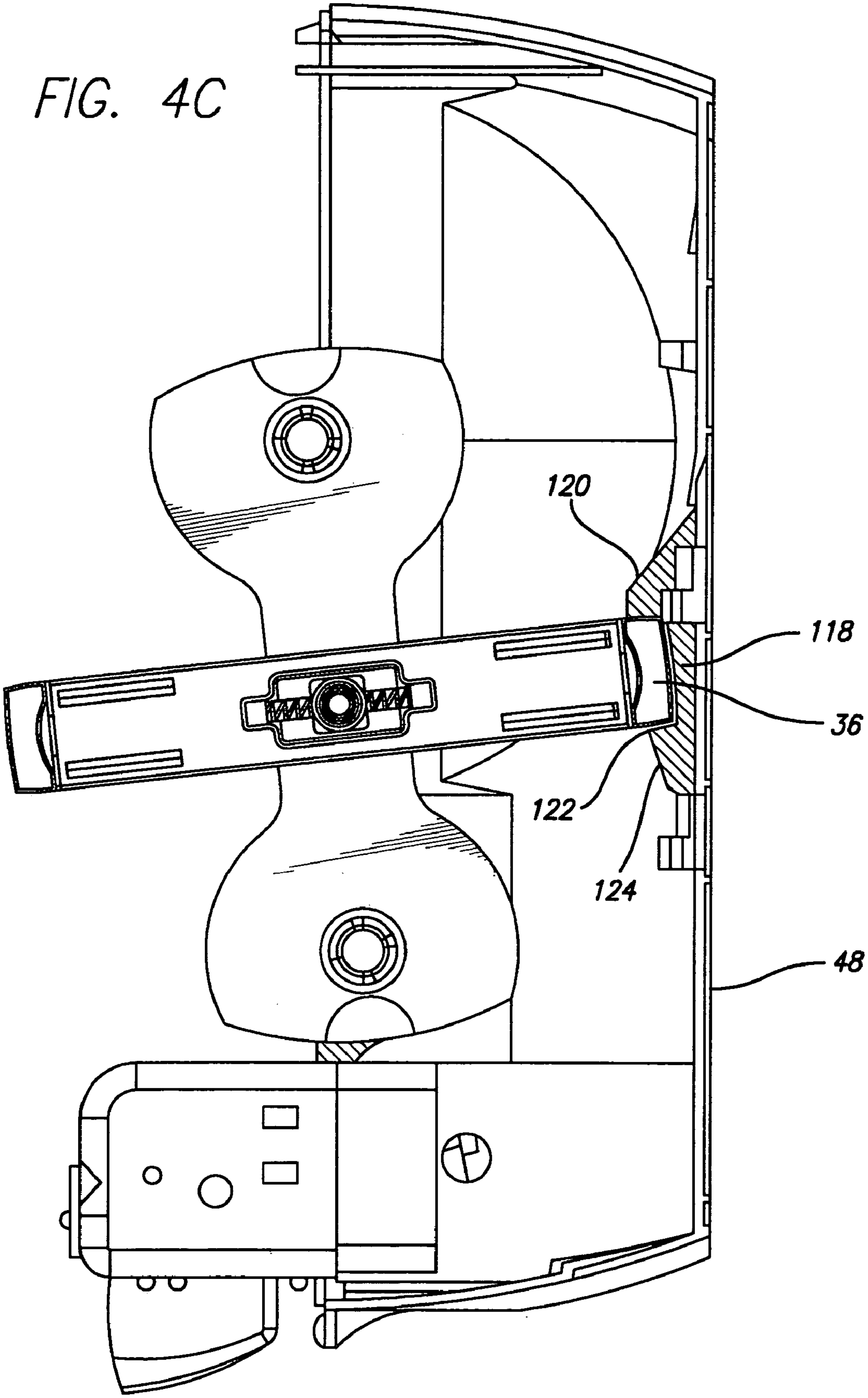
FIG. 4C shows the locking mechanism where the locking bar closest to the rear of the casing is adapted to fit into a mating structure in the rear casing.

The actual locking occurs as shown in FIG. 4C. The locking bar 36 closest to the rear of the casing 48 is adapted to fit into a generally u-shaped mating structure 118 which is adapted to hold the locking bar 36 and prevent it and the carousel assembly 30 from rotating. When the locking bar 36 is pulled away from the rear of the casing 48, the locking bar 36 is disengaged from the mating structure 118. The mating structure has an upper "high" side 120 and a lower "low" side 122, where the low side has a "ramp" 124 on its lower side. As the locking bar 36 is pulled out to clear the high side 120, the carousel assembly 30 is free to rotate such that the top of the carousel assembly 30 rotates up and away from the back of the casing 48. As the carousel assembly 30 begins to rotate, the user releases the locking bar 36 which, under the influence of symmetrically placed compression springs 70, 72 returns to its rest position. As the carousel assembly rotates, the end of the symmetrical locking bar 36 which originally was disposed toward the user now rotates and contacts the ramp 124. A locking bar spring, e.g., 70 or 72, is compressed as the end of the locking bar 36 contacting the ramp 124 now moves up the ramp 124. The end of the locking bar 36 is pressed into the space between the low side 122 and the high side 120, as the end of the locking bar 36 slides past the low side 122. A locked position for the carousel assembly 30 is now reestablished.

FIG. 5 shows the carousel arms 32 adapted to receive the loading of a new roll of towel 66 (FIG. 4A). The arms 32 are slightly flexible and bent outward a small amount when inserting a paper towel roll 66 (FIG. 4A) between two opposite carousel arms 32. A friction reducing rotating paper towel roll hub 34 is inserted into a hole of a paper towel roll 66 (FIG. 4A), such that one roll hub 34 is inserted into a hole on each side of the paper towel roll 66 (FIG. 4A). Also shown in FIG. 5 are the tamper resistant fasteners 74, which attach the friction-reducing rotating paper towel roll hubs 34 to the carousel arms 32.

FIG. 5 shows the surface 76 of the roll hubs 34 and the surface 78 of the carousel arms 66, which contact each other. These contact surfaces 76, 78 may be made of a more frictionless material than that of which the carousel arms 32 and the roll hubs 34 are made. For example, a plastic such as polytetrafluoroethylene (PTFE), e.g., TEFLON®, may be used, as a thin layer on each of the contacting surfaces. The paper towel dispenser 20 and its components may be made of, including but not limited to, plastic, metal, an organic material which may include but is not limited to wood, cardboard, treated or untreated, a combination of these materials, and other materials for batteries, paint, if any, and waterproofing.

Figure 6A:
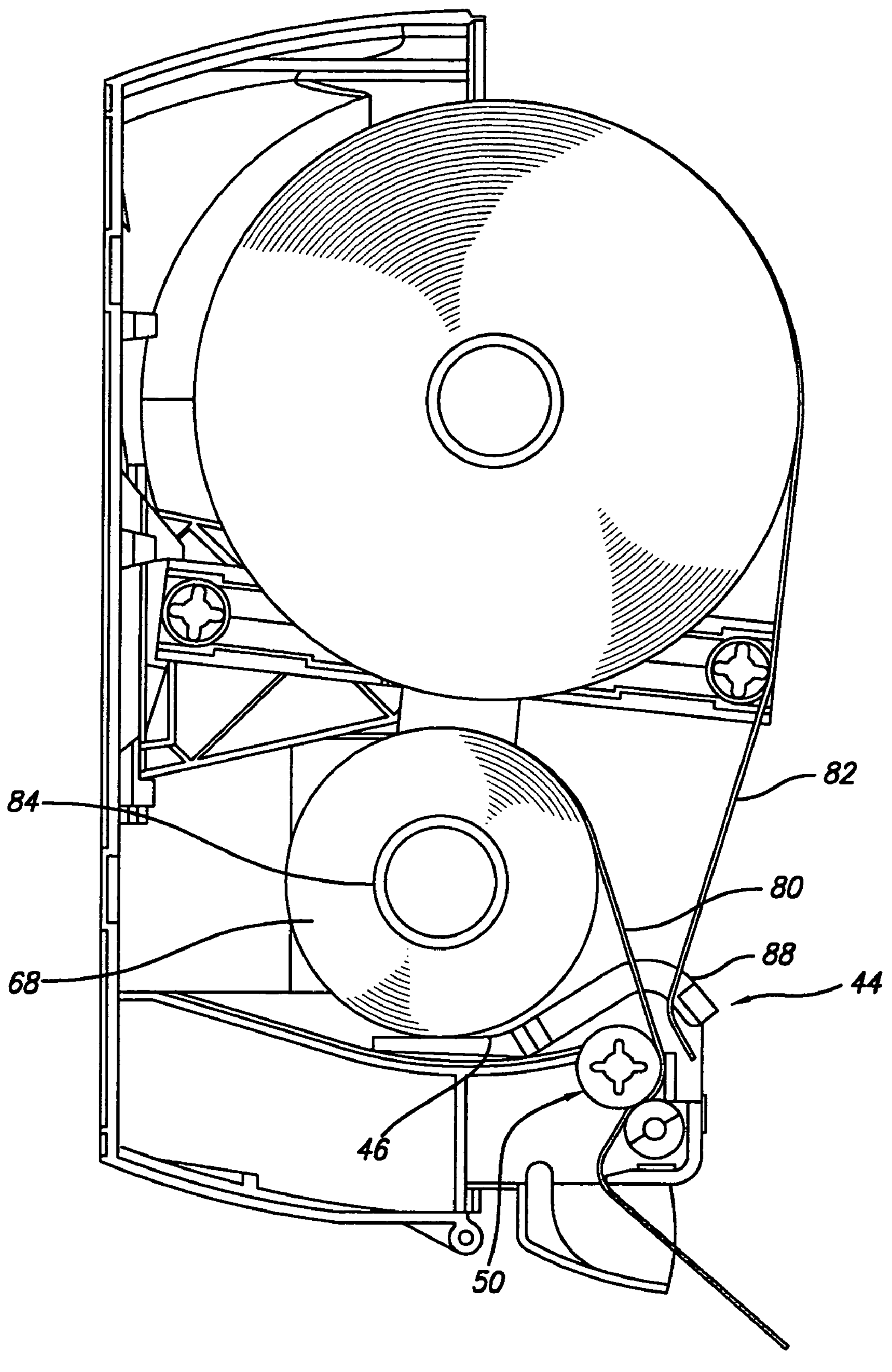
FIG. 6A is a side elevation view of the paper feeding from the stub roll while the tail of the main roll is positioned beneath the transfer bar.

FIG. 6A shows the paper 80 feeding from the stub roll 68 while the tail 82 of the main roll 66 is positioned beneath the transfer bar 44. The legs (visible leg 46, other leg not shown) of the transfer bar 44 rests against the stub roll. When the diameter of the stub roll 68 is larger by a number of winds of paper towel than the inner roll 84, the legs 46 of the transfer bar 44 dispose the bar 88 of the transfer bar 44 to be rotated upward from the feed roller 50.

Figure 6B:
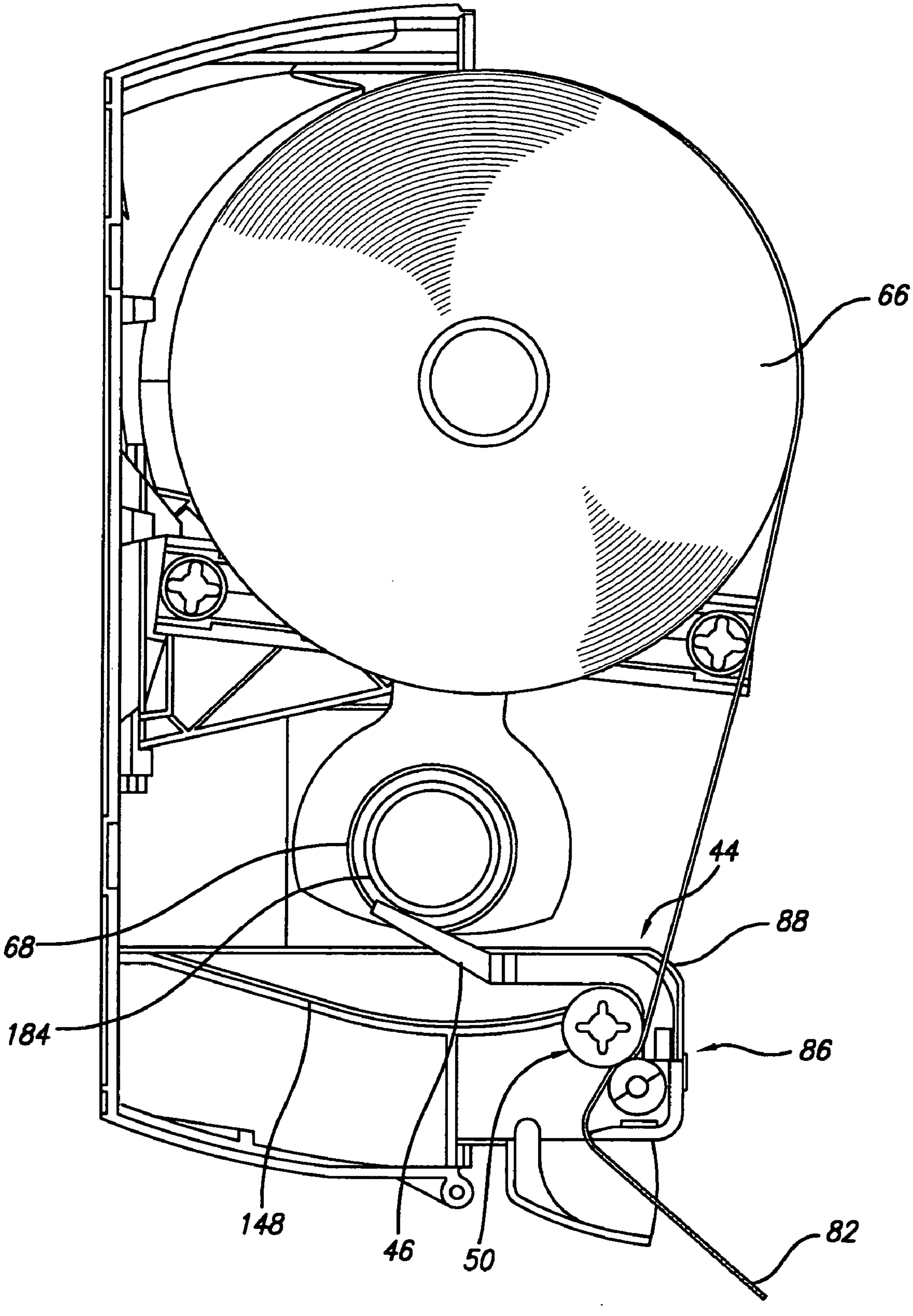
FIG. 6B is a side elevation view of the stub roll is completely exhausted, so that the transfer bar tucks the tail of the main roll into the feed mechanism.

FIG. 6B shows the situation where the stub roll 68 is exhausted, so that the transfer bar 44 tucks the tail 82 of the main roll 66 into the feed mechanism 86. FIG. 6B shows the stub roll 68 position empty, as the stub roll has been used up. The stub roll core 84 is still in place. As the stub roll 68 is used up, the legs 46 of the transfer bar 44 move up toward the stub roll core (inner roll) 84, and the bar 88 of the transfer bar is disposed downward toward the feed roller 50 and toward the top of a structural unit of the dispenser 20 (FIG. 2), such as the top of the electronics module 132 (FIG. 3). Initially the main roll 66 is in reserve, and its tail 82 in an "idling" position such that it is under the transfer bar 44. The main roll 66 and its tail 82 are not initially in a "drive" position. However, as the stub roll 68 is used up, the downward motion of the bar transfer bar, 44 driven by its spring loading, brings the bar 88 of the transfer bar 44 down to engage the main roll tail 82 with the feed roller 50.

Figure 7A:
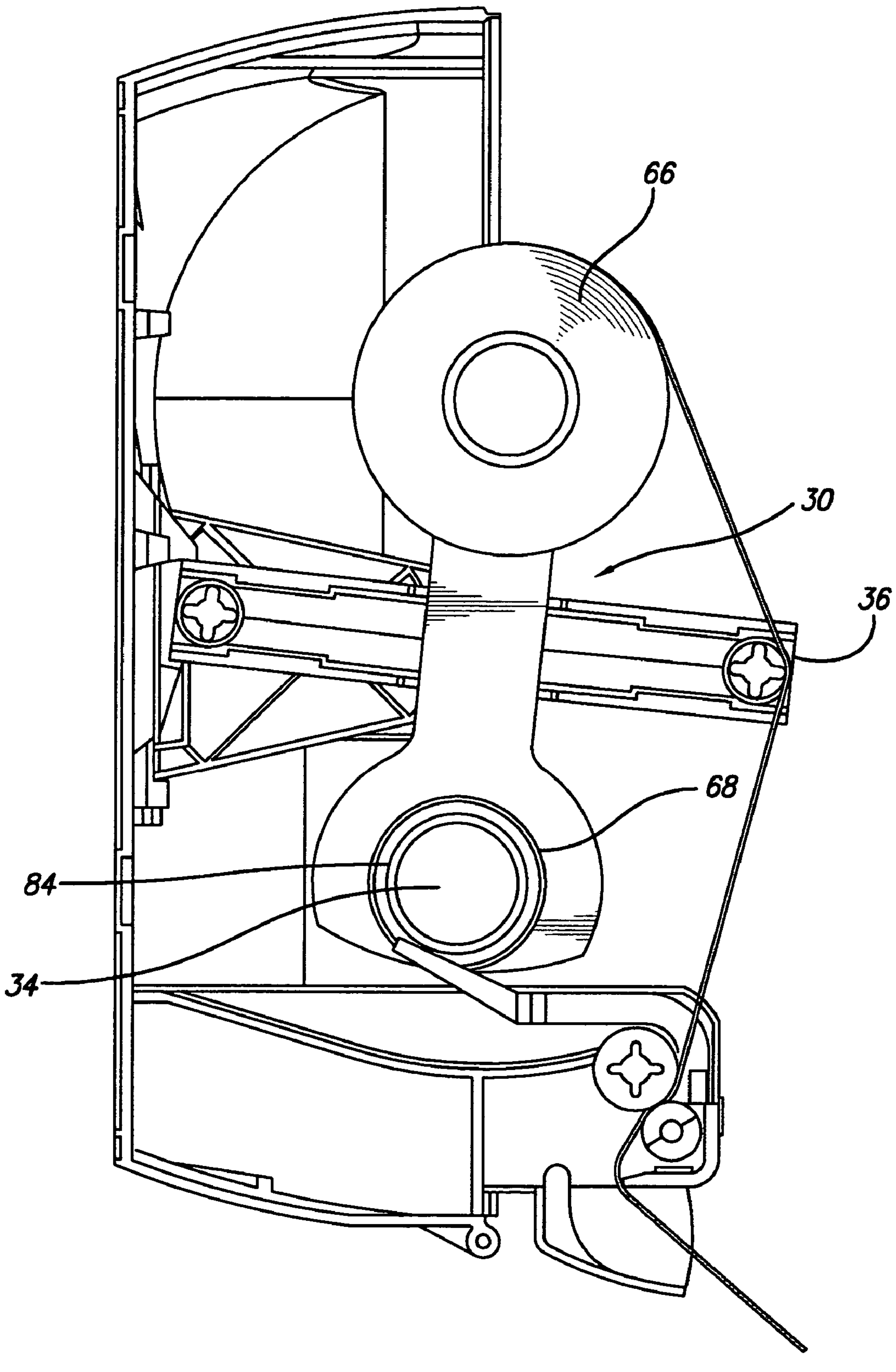
FIG. 7A is a side elevation view of the carousel ready for loading when the main roll reaches a specific diameter.

FIG. 7A shows the carousel assembly 30 ready for loading when the main roll 66 reaches a specific diameter. The diameter of the main roll 66 may be measured by comparison of that diameter with the widened "ear" shape 122 (FIG. 4A) on each end of the carousel arms 32. That part of each carousel arm 32 is made to measure a critical diameter of a main roll 66. The carousel assembly 30 is tilted forward when it is locked. The carousel assembly 30 may rotate unassisted after the locking bar 36 is released, due to the top-heavy nature of the top roll. That is, the torque produced by the gravitational pull on the main-roll 66 is larger than that needed to overcome friction and the counter-torque produced by the now empty stub roll 68.

Figure 7B:
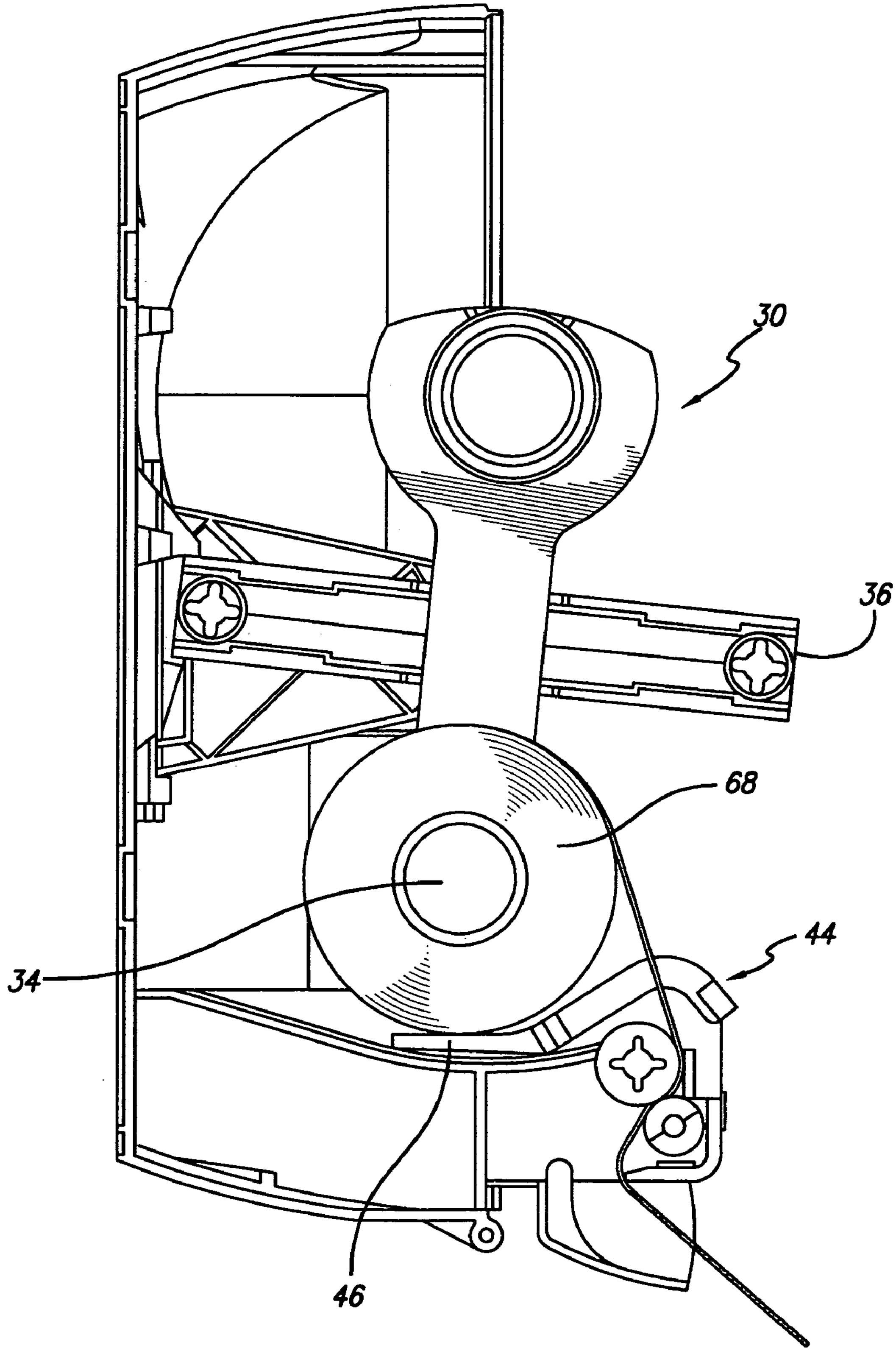
FIG. 7B is a side elevation view of the locking bar being pulled forwardly to allow the carousel to rotate 180°, placing the main roll in the previous stub roll position.

FIG. 7B shows the process of loading where the service person pulls the locking bar 36 and allows the carousel to rotate 180°, placing the main roll 66 in the previous stub roll 68 position. Now a new full sized roll 66 can be loaded onto the main roll 66 position. The transfer bar 44 automatically resets itself. The transfer bar 44 is spring loaded so as to be disposed with the transfer bar legs 46 pressed upward against the stub roll 68 or the stub roll core 84. The transfer bar legs 46 are adapted to be disposed inward of the roll hubs 34 so the bar 88 of the transfer bar 44 will have a positive stop at a more rigid location, in this case, the top of the electronics module 132 (FIG. 2).

Figure 7C:
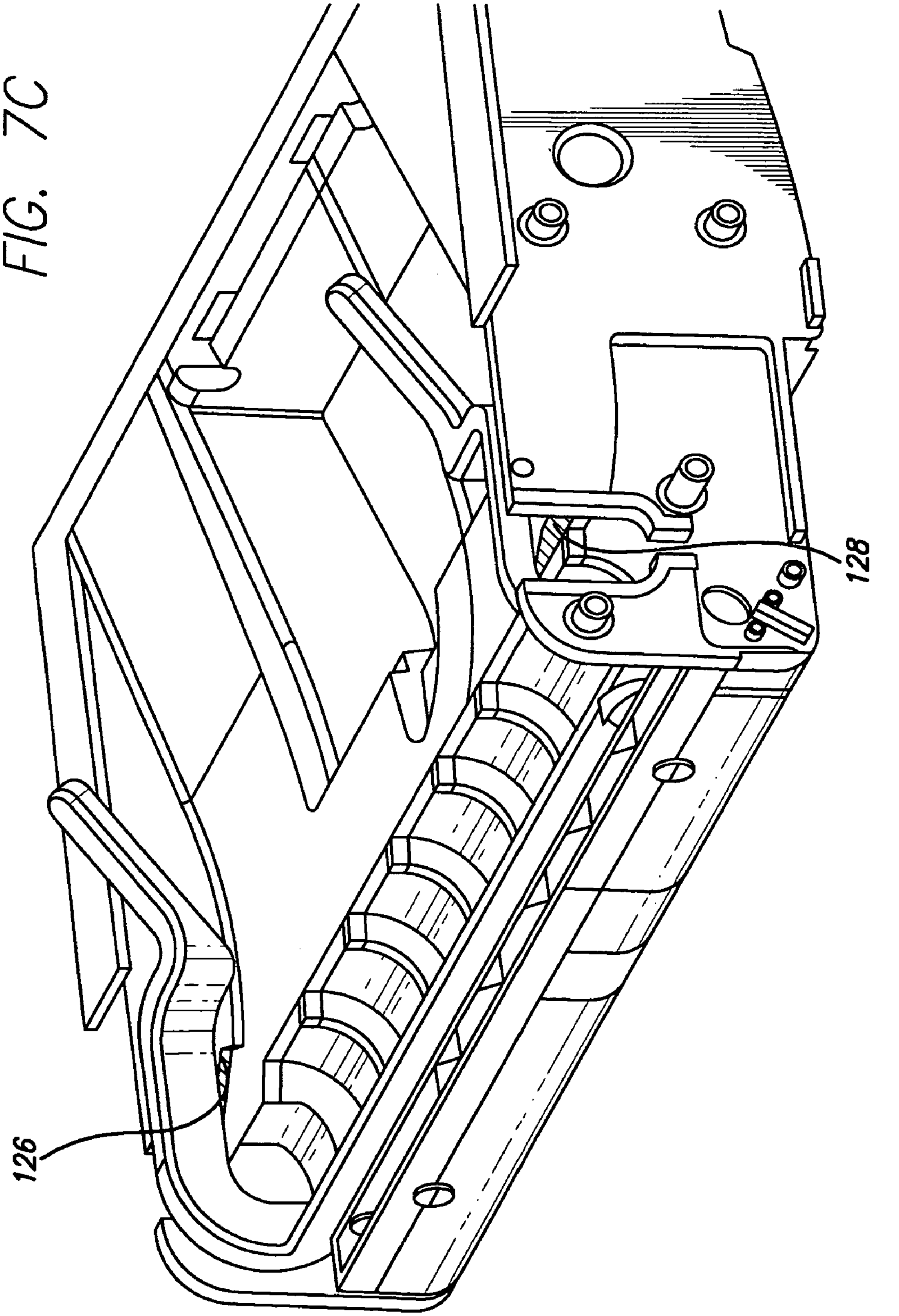
FIG. 7C shows the extension springs which tend to maintain the transfer bar legs in contact with the stub roll.

FIG. 7C shows the extension springs 126, 128 which tend to maintain the transfer bar legs 46 in contact with the stub roll 68 or stub roll core 84. The transfer bar 44 contains the two extension springs 126, 128. The spring forces are typically 0.05 lbf to 0.5 lbf in the bar 44 lowered position and 0.2 lbf to 1.0 lbf in the bar 44 raised position. In this embodiment, the spring forces are 0.2 lbf in the lowered position an 0.43 lbf in the raised position. The force of the two springs 126, 128 is additive so that the transfer bar 44 is subject to a total spring force of 0.4 lbf in the lowered position and 0.86 lbf in the raised position.

Figure 7D:
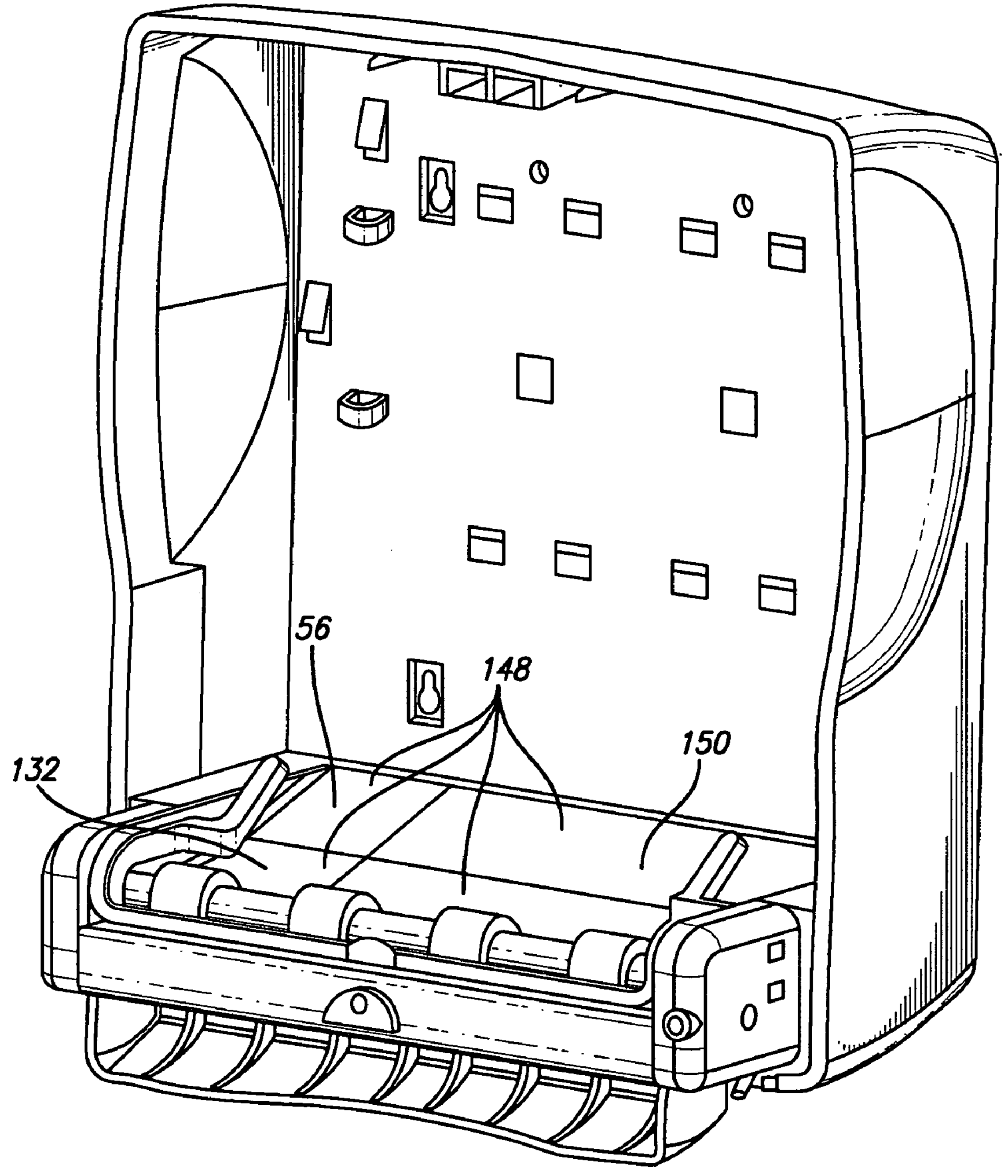
FIG. 7D shows the cleanable floor of the dispenser.

While modular units (FIG. 7D) such as the electronics module 132, the motor 56 module, and the battery case 150, are removable, they fit, or "snap" together so that the top of the electronics unit 132, the top of the motor 56 module and remaining elements of the "floor" 148 of the dispensing unit 20 form a smooth, cleanable surface. Paper dust and debris tend to accumulate on the floor 148 of the dispenser 20. It is important that the dispenser 20 is able to be easily cleaned as part of the maintenance procedure. A quick wiping with a damp cloth will sweep out and pick up any undesirable accumulation. The removable modular dispensing shelf 64 may be removed for rinsing or wiping.

The feed roller 50 may be driven by a motor 56 which in turn may be driven by a battery or batteries 58, driven off a 100 or 220V AC hookup, or driven off a transformer which is run off an AC circuit. The batteries may be non-rechargeable or rechargeable. Rechargeable batteries may include, but not be limited to, lithium ion, metal hydride, metal-air, nonmetal-air. The rechargeable batteries may be recharged by, but not limited to, AC electromagnetic induction or light energy using photocells.

A feed roller 50 serves to feed the paper towel being dispensed onto the curved dispensing ribs 52. A gear train (not visible) may be placed under housing 86, (FIG. 3) for driving the feed roller. A control unit 54 (FIG. 3) for a motor 56 (FIG. 3) may be utilized. A proximity sensor (not shown) or a hand-operated switch 64 may serve to turn the motor 56 on and off.

As an enhancement and further development of a system for delivering paper towel to the end user in as cost effective manner and user-friendly manner as possible, an automatic means for dispensing the paper towel is desirable, making it unnecessary for a user to physically touch a knob or a lever. Therefore, a more hygienic dispenser is present. This dispenser will contribute to less transfer of matter, whether dirt or bacteria, from one user to the next. The results of washing ones hands will tend to be preserved and hygiene increased.

An electronic proximity sensor is included as part of the paper towel dispenser. A person can approach the paper towel dispenser, extend his or her hand, and have the proximity sensor detect the presence of the hand. Upon detection of the hand, a motor is energized which dispenses the paper towel. It has long been known that the insertion of an object with a dielectric constant into a volume with an electromagnetic field will tend to modify the properties, which the electromagnetic field sees. The property of the hand, a dielectric constant close to that of water, is enough to alter the net capacitance of a suitable detector circuit.

Figure 8A:
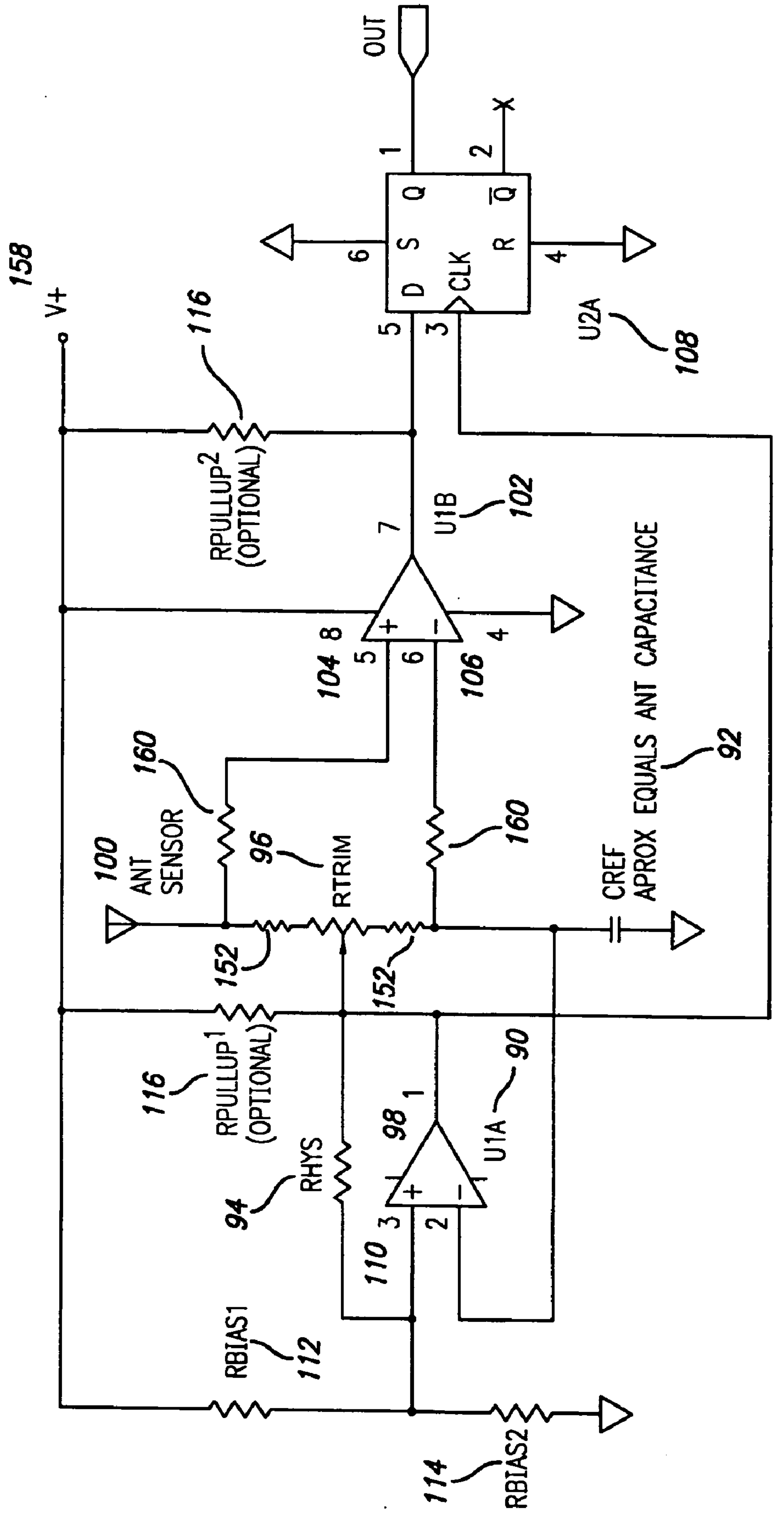
FIG. 8A shows a schematic of the proximity circuit.
Figure 9:
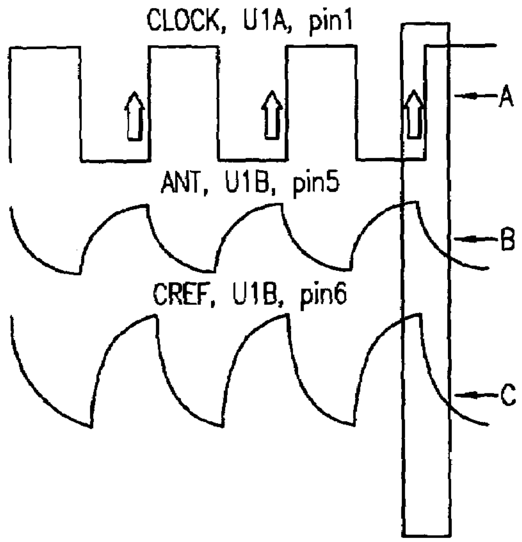
FIG. 9 shows U1 waveforms at pin 1 (square wave A), pin 5 (exponential waveform B) and pin 6 (exponential waveform C)

An embodiment of the invention comprises a balanced bridge circuit. See FIG. 8A. The component U1A 90 is a comparator (TLC3702 158) configured as an oscillator. The frequency of oscillation of this component, U1A 90, of the circuit may be considered arbitrary and non-critical, as far as the operation of the circuit is concerned. The period of the oscillator is set by the elements $C_{ref}$ 92, $R_{hys}$ 94, the trim resistance, $R_{trim}$ 96, where the trim resistance may be varied and the range resistors $R_{range}$ 152 are fixed. The resistors Rrange 152 allow limits to be placed on the range of adjustment, resulting in an easier adjustment. The adjustment band is narrowed, since only part of the total resistance there can be varied. Consequently a single potentiometer may be used, simplifying the adjustment of $R_{trim}$ 96. A value for $R_{range}$ 152 for the schematic shown in FIG. 8A might be 100 kΩ. $R_{trim}$ 96 might have an adjustment range of 10 kΩ to 50 kΩ. The output signal at pin 1 98 of component U1A 90 is a square wave, as shown at line A of FIG. 9. $C_{ref}$ 92 is charged by the output along with ANT 100, both sustaining the oscillation and measuring the capacitance of the adjacent free space. The signals resulting from the charging action are applied to a second comparator, U1B 102, at pin 5 104 and pin 6 106 (FIG. 8A). These signals appear as exponential waveforms, as shown at lines B and C of FIG. 9.

Figure 8B:
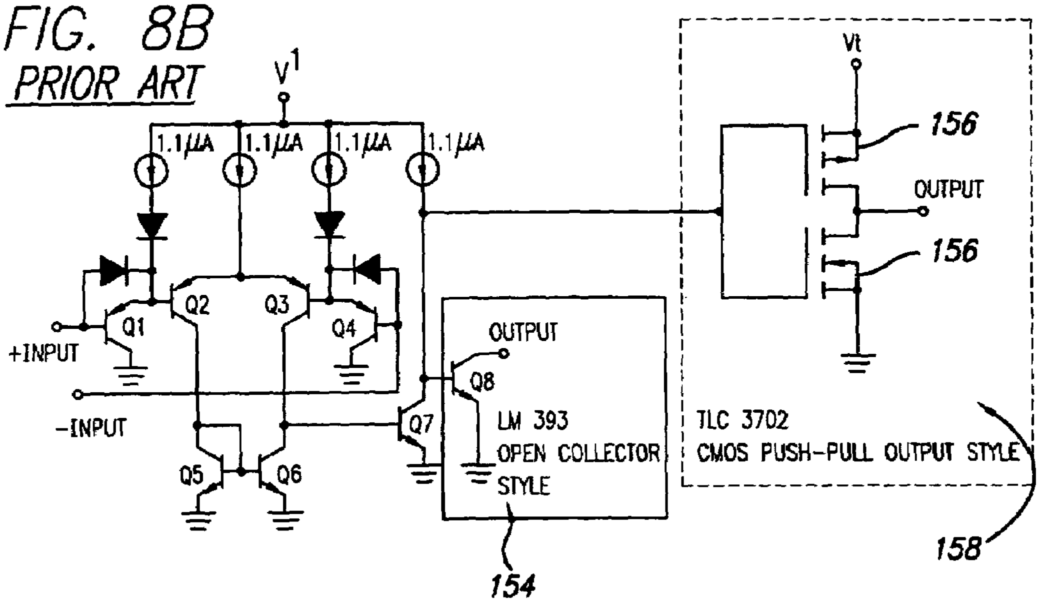
FIG. 8B PRIOR ART
FIG. 8B (prior art) shows the schematic for the National Semiconductor dual comparator LM393.

The simplest form of a comparator is a high-gain differential amplifier, made either with transistors or with an op-amp. The op-amp goes into positive or negative saturation according to the difference of the input voltages because the voltage gain is typically larger than 100,000, the inputs will have to be equal to within a fraction of a millivolt in order for the output not to be completely saturated. Although an ordinary op-amp can be used as comparator, there are special integrated circuits intended for this use. These include the LM306, LM311, LM393 154 (FIG. 8A), LM393V, NE627 and TLC3702 158. The LM393V is a lower voltage derivative of the LM393 154. The LM393 154 is an integrated circuit containing two comparators. The TLC3702 158 is a micropower dual comparator with CMOS push-pull 156 outputs. FIG. 8B (prior art) is a schematic which shows the different output structures for the LM393 and the TLC3702. The dedicated comparators are much faster than the ordinary op-amps.

The output signal at pin 1 98 of component U1A 90, e.g., a TL3702 158, is a square wave, as shown in FIG. 2A. Two waveforms are generated at the inputs of the second comparator, U2B 102. The first comparator 90 is running as an oscillator producing a square-wave clocking signal, which is input, to the clock input of the flip-flop U2A 108, which may be, for example, a Motorola D flip-flop, No. 14013.

Running the first comparator as a Schmitt trigger oscillator, the first comparator U1A 90 is setup to have positive feedback to the non-inverting input, terminal 3 110. The positive feedback insures a rapid output transition, regardless of the speed of the input waveform. $R_{hys}$ 94 is chosen to produce the required hysteresis, together with the bias resistors $R_{bias1}$ 112 and $R_{bias2}$ 114. When these two bias resistors, $R_{bias1}$ 112, $R_{bias2}$ 114 and the hysteresis resistor, $R_{hys}$ 94, are equal, the resulting threshold levels are ⅓ V+ and ⅔ V+, where V+158 is the supply voltage. The actual values are not especially critical, except that the three resistors $R_{bias1}$ 112, $R_{bias2}$ 114 and $R_{hys}$ 94, should be equal, for proper balance. The value of 294 kΩ maybe used for these three resistors, in the schematic shown in FIG. 8A.

An external pull-up resistor, $R_{pullup1}$ 116, which may have a value, for example, of 470 Ω, is only necessary if an open collector, comparator such as an LM393 154 is used. That comparator 154 acts as an open-collector output with a ground-coupled emitter. For low power consumption, better performance is achieved with a CMOS comparator, e.g., TLC3702, which utilizes a CMOS push-pull output 156. The signal at terminal 3 110 of U1A charges a capacitor $C_{ref}$ 92 and also charges an ANT sensor 100 with a capacitance which $C_{ref}$ 92 is designed to approximate. A value for $C_{ref}$ for the schematic of FIG. 8A, for the most current board design, upon which it depends, is about 10 pF. As the clocking square wave is effectively integrated by $C_{ref}$ 92 and the capacitance of ANT 100, two exponential signals appear at terminals 5 104 and 6 106 of the second comparator U1B, through the $R_{protect}$ 160 static protection resistors. $R_{protect}$ 160 resistors provide limiting resistance which enhances the inherent static protection of a comparator input lines, particularly for the case of pin 5 104 of U1B 102. In the schematic shown in FIG. 8A, a typical value for $R_{protect}$ 160 might be 2 kΩ. One of the two exponential waveforms will be greater, depending upon the settings of the adjustable resistance $R_{trim}$ 96, $C_{ref}$ 92, and ANT 100. The comparator U1B 102 resolves small differences, reporting logic levels at its output, pin 7 118. As the waveforms may initially be set up, based on a capacitance at ANT 100 of a given amount. However, upon the intrusion of a hand, for example, into the detection field of the antenna ANT 100, the capacitance of ANT 100 is increased significantly and the prior relationship of the waveforms, which were set with ANT 100 with a lower capacitance, are switched over. Therefore, the logic level output at pin 7 118 is changed and the d flip-flop 108 state is changed via the input on pin 5 of the D flip-flop 108.

The second comparator 102 provides a digital quality signal to the D flip-flop 108. The D flip-flop, U2A 108, latches and holds the output of the comparator U1B 90. In this manner, the second comparator is really doing analog-to-digital conversion. A suitable D flip-flop is a Motorola 14013.

The presence, and then the absence, of a hand can be used to start a motorized mechanism on a paper towel dispenser, for example. An embodiment of the proximity detector uses a single wire or a combination of wire and copper foil tape that is shaped to form a detection field. This system is very tolerant of non-conductive items, such as paper towels, placed in the field. A hand is conductive and attached to a much larger conductor to free space. Bringing a hand near the antenna serves to increase the antenna's apparent capacitance to free space, forcing detection.

The shape and placement of the proximity detector's antenna (FIG. 8A, 100) turns out to be of some importance in making the proximity sensor work correctly. Experimentation showed that a suitable location was toward the lower front of the dispenser unit. The antenna (FIG. 8A, 100) was run about two-thirds the length of the dispensing unit, in a modular, replaceable unit above the removable dispensing shelf 62 (FIG. 3). This modular unit would be denoted on FIG. 3 as 120.

A detection by the proximity detection circuit (FIG. 8A) in the module 120 sets up a motor control flip flop so that the removal of the hand will trigger the start of the motor cycle. The end of the cycle is detected by means of a limit switch which, when closed, causes a reset of the flip-flop and stops the motor. A cycle may also be initiated by closing a manual switch.

A wide range of sensitivity can be obtained by varying the geometry of the antenna and coordinating the reference capacitor. Small antennae have short ranges suitable for non-contact pushbuttons. A large antenna could be disposed as a doorway-sized people detector. Another factor in sensitivity is the element applied as $R_{trim}$. If $R_{trim}$ 96 is replaced by an adjustable inductor, the exponential signals become resonant signals with phase characteristics very strongly influenced by capacitive changes. Accordingly, trimming with inductors may be used to increase range and sensitivity. Finally, circuitry may be added to the antenna 100 to improve range and directionality. As a class, these circuits are termed "guards" or "guarding electrodes," old in the art, a type of shield driven at equal potential to the antenna. Equal potential insures no charge exchange, effectively blinding the guarded area of the antenna rendering it directional.

The antenna design and trimming arrangement for-the paper towel dispenser application is chosen for adequate range and minimum cost. The advantages of using a guarded antenna and an adjustable inductor are that the sensing unit to be made smaller.

From a safety standpoint, the circuit is designed so that a detection will hold the motor control flip-flop in reset, thereby stopping the mechanism. The cycle can then begin again after detection ends.

The dispenser has additional switches on the control module 54. FIG. 3 shows a "length-of-towel-to-dispense-at-one-time" ("length")switch 134. This switch 134, is important in controlling how long a length of paper towel is dispensed, for each dispensation of towel. It is an important setting for the owner of the dispenser on a day-to-day basis in determining cost (to the owner) versus the comfort (to the user) of getting a large piece of paper towel at one time.

A somewhat similar second switch 136 is "time-delay-before-can-activate-the-dispensing-of another-paper-towel" ("time-delay") switch 136. The longer the time delay is set, the less likely a user will wait for many multiple towels to dispense. This tends to save costs to the owner. Shortening the delay tends to be more comfortable to a user.

A third switch 138 is the sensitivity setting for the detection circuit. This sensitivity setting varies the resistance of $R_{trim}$ 96 (FIG. 8A). Once an effective antenna 100 (FIG. 8A) configuration is set up, the distance from the dispenser may be varied. Typical actual use may require a sensitivity out to one or two inches, rather than four or six inches. This is to avoid unwanted dispensing of paper towel. In a hospital setting, or physician's office, the sensitivity setting might be made fairly low so as to avoid unwanted paper towel dispensing. At a particular work location, on the other hand, the sensitivity might be set fairly high, so that paper towel will be dispensed very easily.

While it is well known in the art how to make these switches according to the desired functionalities, this switch triad may increase the usefulness of the embodiment of this invention. The system, as shown in the embodiment herein, has properties of lowering costs, improving hygiene, improving ease of operation and ease of maintenance. This embodiment of the invention is designed to consume low power, compatible with a battery or battery pack operation. In this embodiment, a 6 volt DC supply is utilized. A battery eliminator may be use for continuous operation in a fixed location. There is a passive battery supply monitor that will turn on an LED indicator if the input voltage falls below a specified voltage.

A second embodiment of this invention comprises a second electronic proximity sensor. The second detector circuit is a miniaturized, micro-powered, capacitance-based proximity sensor designed to detect the approach of a hand to a towel dispenser. It features stable operation and a three-position sensitivity selector.

Figure 10:
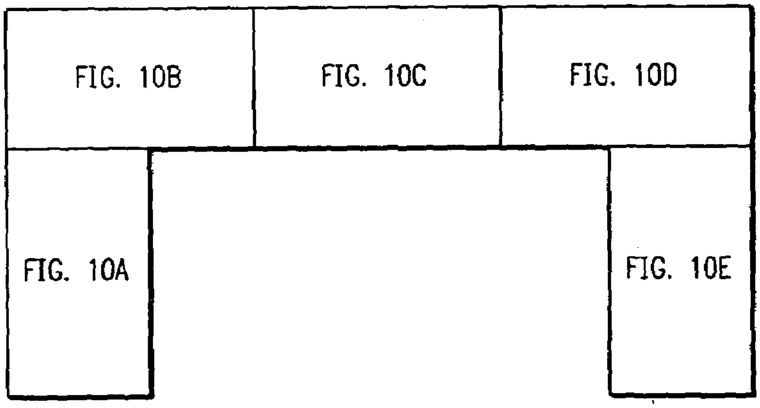
FIG. 10 shows a schematic of a second proximity switch.

FIG. 10 shows the whole proximity detector circuit. In order to examine the circuit more carefully, FIG. 10 is broken out into sections 10A through 10E. These component circuits are shown separately as FIGS. 10A through 10E, corresponding to the breakout shown in FIG. 10.

Figure 10A:
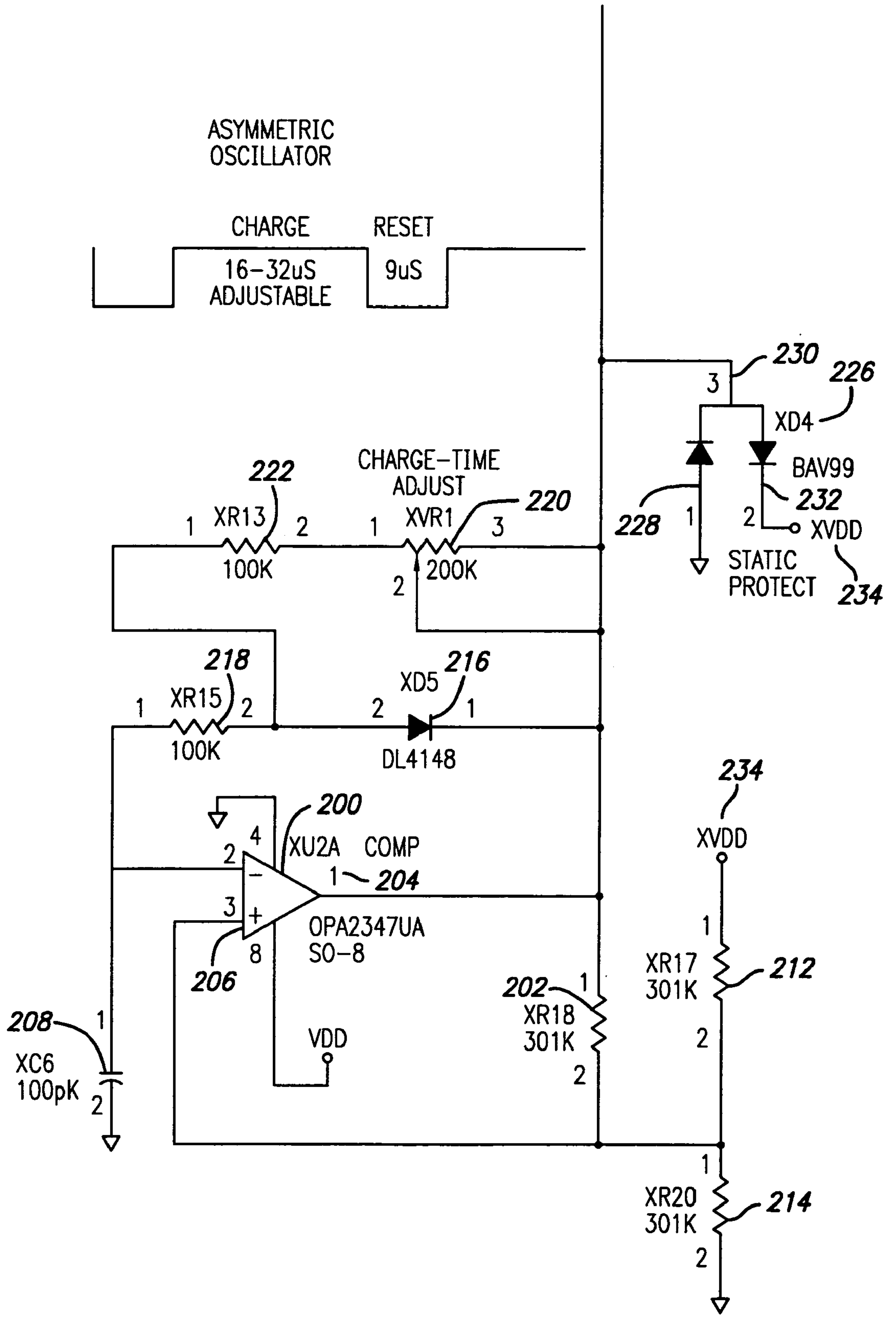
FIG. 10A shows the asymmetric oscillator and the first static protection circuit.
Figure 10A:
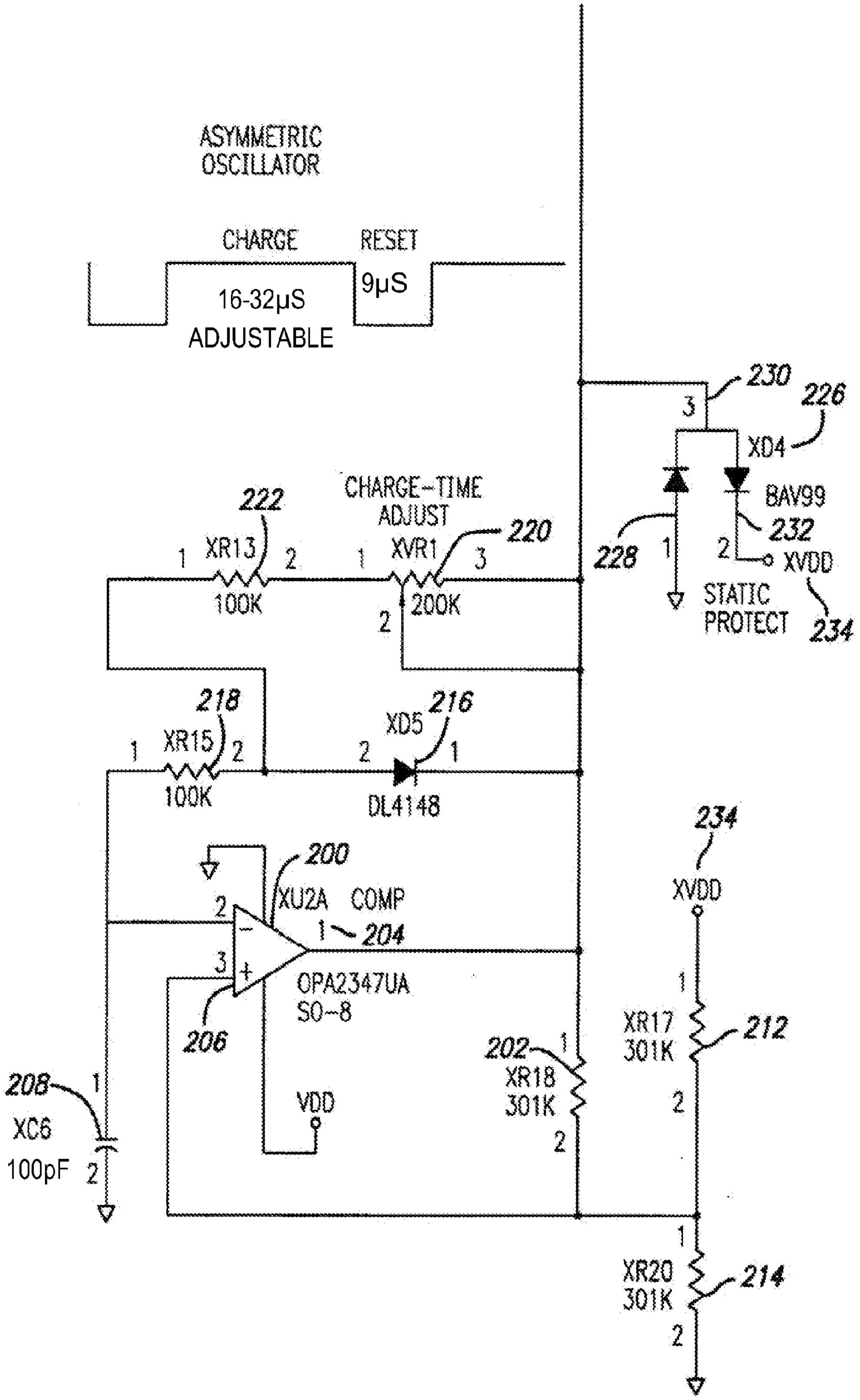

At the heart of the proximity detector is an adjustable asymmetric rectangular wave oscillator running in a range of 24 kHz to 40 kHz, as shown in FIG. 10A. Once an initial adjustment has been set it is not readjusted during operation, normally. The asymmetrical feature of having a longer on-time and shorter off-time allows for more useable signal, i.e., on-time. This 24 kHz to 40 kHz oscillation range provides a basis for a high rate of sampling of the environment to detect capacitance changes, as detailed below. As shown, a fast comparator, XU2A 200, has positive feedback through XR18 202 from the output terminal 1 204 (XU2A) to the positive input terminal 3 206 (XU2A). The comparator operates as a Schmitt trigger oscillator with positive feedback to the non-inverting input, terminal. The positive feedback insures a rapid output transition, regardless of the speed of the input waveform. As the capacitor XC6 208 is charged up, the terminal 3 206 of the XU2A 200 comparator reaches ⅔ $XV_{DD}$. This voltage ⅔ $XV_{DD}$ is maintained on terminal 3 206 by the voltage dividing network XR17 212 and XR20 214, and the positive feedback resistor XR18 202 that is in parallel with XR17 212, where XR17 212 and XR20 214 and XR18 202 are all equal resistances. The simplest form of a comparator is a high-gain differential amplifier, made either with transistors or with an op-amp. The op-amp goes into positive or negative saturation according to the difference of the input voltages because the voltage gain is typically larger than 100,000, the inputs will have to be equal to within a fraction of a millivolt in order for the output not to be completely saturated. Although an ordinary op-amp can be used as comparator, there are special integrated circuits intended for this use. For low power consumption, better performance is achieved with a CMOS comparator, such as a TEXAS INSTRUMENT® TLC3702CD 158 (FIG. 8B). The TLC 3702 158 is a micropower dual comparator with CMOS push-pull 156 (FIG. 8B) outputs. These dedicated comparators are much faster than the ordinary op-amps.

As the transition occurs, the output, at the output terminal 1 204, goes relatively negative, XD5 216 is then in a forward conducting state, and the capacitor XC6 208 is preferentially discharged through the resistance XR15 218 (100 kΩ) and the diode XD5 216.

The time constant for charging the capacitor XC6 208 is determined by resistors XVR1 220, XR13 222 and XR15 218. The resistor XR15 218 and the diode XD5 216 determine the time constant for discharge of the capacitor XC6 208.

Figure 10B:
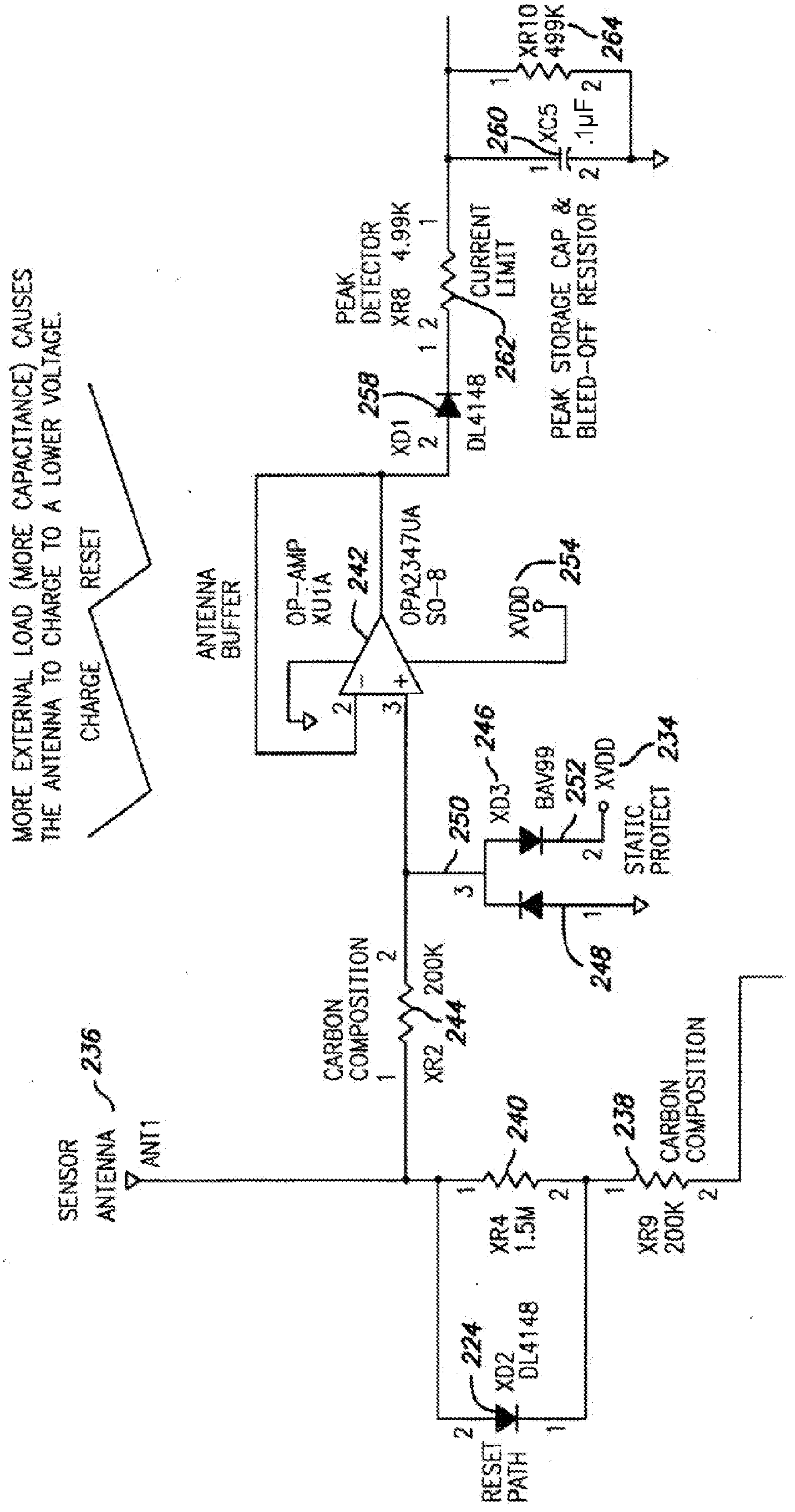
FIG. 10B shows the antenna, the antenna reset circuit, a second static protection circuit, the antenna buffer unity follower circuit, and the peak detector circuit; and a peak detector circuit.
Figure 10C:
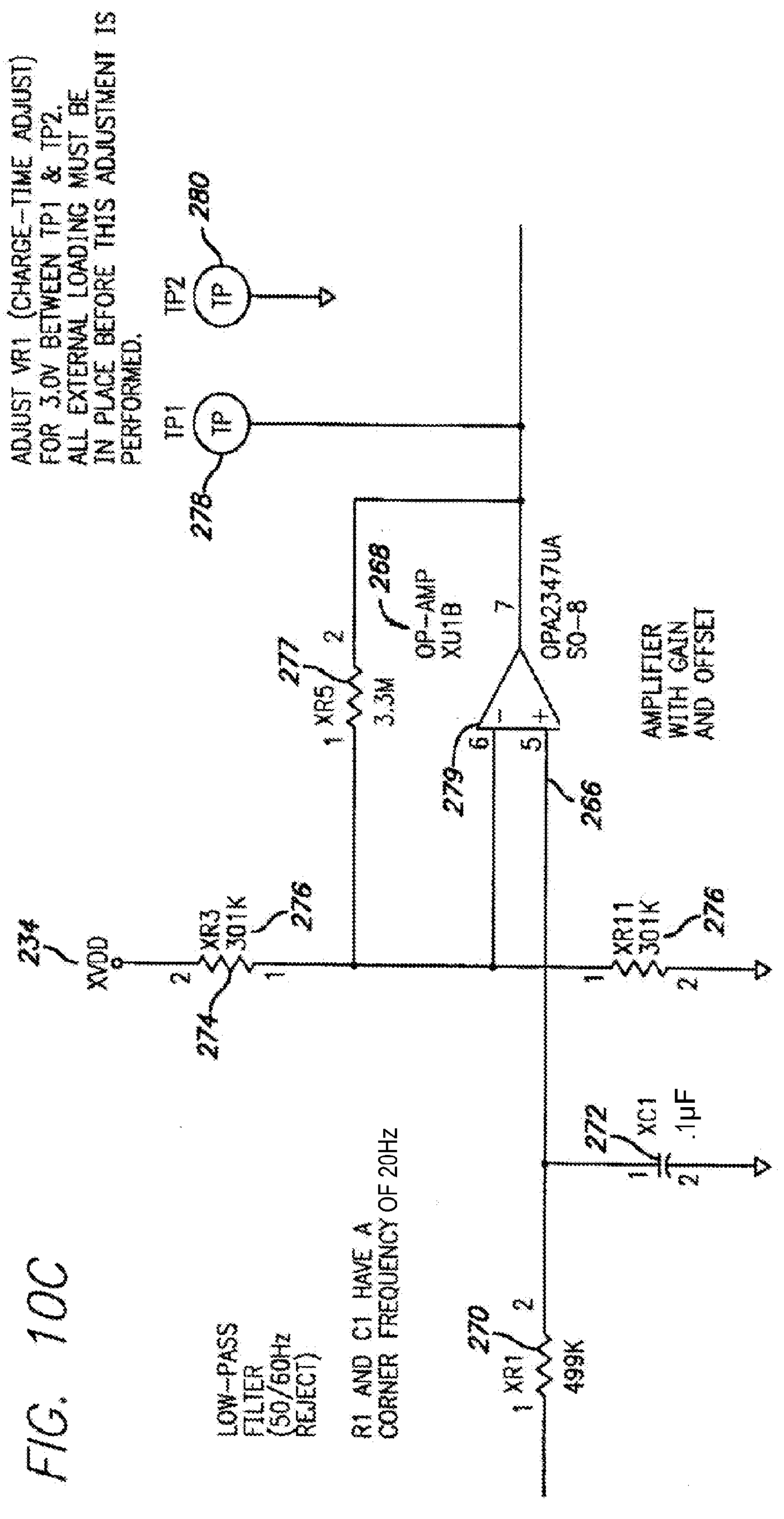
FIG. 10C shows the low pass filter for rejecting 50/60 Hz, the amplifier circuit, and the test points for adjusting VR1 to 3.0 V with all eternal capacitance-like loads in place.

The reset time is fixed at 9 μs by XD5 216 and XR15 218. The rectangular wave source supplying the exponential to the antenna, however, can be varied from 16 to 32 μs, utilizing the variable resistance XVR1 220 and the resistors XR13 222 and XR15 218. Once set up for operational the variable resistance is not changed. The asymmetric oscillator can produce more signal (16 μs to 32 μs, as compared to the reset time. The reset time is not especially important, but the reset level is both crucial and consistent. The exponential waveform always begins one "diode voltage drop" (vbe) above the negative rail due to the forward biased diode voltage drop of XD2 224 (FIG. 10B). One "diode voltage drop" (vbe) is typically in the range 0.5 V to 0.8 V, or typically about 0.6 V.

The dual diode XD4 226 (FIG. 10A) provides protection from static electricity. Terminal 1 228 of XD4 226 will conduct when terminal 3 230 is at least one diode voltage drop below the ground, or negative rail. Terminal 2 232 will conduct when terminal 3 230 is at least one diode voltage drop above $V_{DD}$ 234. Therefore, the signal level at terminal 3 230 is limited to the range–vbe to VDD+vbe, thereby eliminating voltage spikes characteristic of "static", which may be induced by lightening or the operation of electrical motors, for example. The static is primarily built up by the internal mechanisms of the towel dispenser and the movement of the paper and is discharged by bringing a waving hand near the sensor.

The asymmetric square wave charges the antenna 236 (FIG. 10B) through the resistors XR9 238 and XR4 240. The sum resistance, XR, is equal to XR9 238 plus XR4 240, or 1.7 MΩ, for the example values shown in FIGS. 10 and 10B. The antenna 236 forms one conducting side of a capacitor, while the atmosphere and other materials form a dielectric between the antenna as one conducting element and other conductive materials including buildings and the actual earth as a second conductive element. The capacitance C of the antenna 236 relative to "free space" is approximately 7 pF to 8 pF, as determined by experiment, yielding a time constant τ, where τ is equal to RC. Thus, the time constant, for the exemplary values, is about 13 μs.

If a hand of a person is placed in proximity to the antenna of the circuit, the capacitance of the antenna to free space may double to about 15 pF with a resultant longer time constant and lower amplitude exponential waveform. The time constant τ is increased to about 26 μs. While it is possible to directly compare the signals, it is also desirable to have as stable an operating circuit as possible while retaining a high sensitivity and minimizing false positives and false negatives with respect to detection. To aid in achieving these goals, the signal is conditioned or processed first.

Looking at the operational amplifier XU1A 242, the (signal) waveform sees very high impedance, since operational amplifiers have high input impedance. The impedance on the antenna 236 side of the operational amplifier 242, in the form of resistance, is about 1.9 MΩ. The impedance on the other side of the operational amplifier is of the order of 5 kΩ. In order to provide an impedance buffer the signal the operational amplifier UX1A 242 is set up as a unity follower with a voltage gain of 1.0, that is, the gain given by $V_{out}/V_{in}$ equals one. The unity follower has an input-side (of the operational amplifier) resistance of about 1.0 TΩ ($10^{13}$ Ω). The (operational amplifier's) output impedance is in a range about 40 to 600 to several thousand ohms. Consequently, this unity follower configuration serves to isolate or buffer the upstream high-impedance circuit from the downstream low impedance circuit.

The resistor XR2 244 acts as a current limitor, since the current i is equal to V/XR2 at XR2 244. Further protection against static is provided by the diode pair XD3 246 in the same way as diode pair XD4 226 (FIG. 1A). Terminal 1 248 of XD3 246 will conduct when terminal 3 250 is at least one diode voltage drop below the ground, or negative rail. Terminal 2 252 will conduct when terminal 3 250 is at least one diode voltage drop above $V_{DD}$. Therefore, the signal level at terminal 3 250 is limited to the range–vbe to $V_{DD}$+vbe, so that voltage spikes characteristic of "static" are eliminated.

Asymmetric oscillator pulses, after detecting capacitance which either includes or does not include a proximate dielectric equivalent to that of a proximate hand, act on the positive (non-inverting) input terminal 254 of the unity follower operational amplifier 242 to produce a linear output at its output terminal 256. The state of the output terminal is determined by first, the length of the asymmetric on pulse, and within the time of the "on" pulse, the time taken to charge up the antenna 236 (as capacitor) and the time to discharge through XR2 244 to the non-inverting input terminal 254. The time-constant-to-charge is 13 μs to 26 μs. The time-constant-to-discharge is 0.8 to 1.6 μs. To charge the antenna 236 to a certain charge, Q, for a capacitance based on a dielectric constant for "free space" of $\in_0$, i.e., $C\in_0$, a voltage of $V=Q/C\in_0$ is required. For the case of a capacitance, i.e., $C\in_0+\in$, which includes a detectable hand in "free space," the voltage required to store charge Q is $Q/C\in_0+\in$. However, $C\in_0+\in$ is about twice $C\in_0$, so that the voltage peak for the detected hand is about half of the no-hand-present case.

The diode XD1 258 allows positive forward conduction but cuts off the negative backward conduction of a varying signal pulse. The forward current, or positive peak of the current, tends to charge the capacitor XC5 260. The diode XD1 258, the resistor XR8 262, the capacitor XC5 260 and the bleed resistor XR10 264 comprise a peak detector network. XD1 258 and XC5 260 capture the positive peak of the exponential waveform. XR8 262 prevents oscillation of XU1A 242. XR8 262 limits the charging time constant to 5 ms, where XR8 262 is 4.99 kΩ and XC5 260 is 0.1 μF. This has an averaging effect on the peak detection and prevents noise spikes from pumping up the detector. The resistor XR10 264 discharges the detector at a half-second time constant.

When the hand is detected, the stored charge on XC8 260 is such that the voltage is sufficient to raise the input to the non-inverting terminal 266 of operational amplifier XU1B 268 above ½$XV_{DD}$, so as to drive that operational amplifier output to a usable linear voltage range.

The combination of the resistor XR1 270 (e.g., 499 kΩ) and the capacitor XC1 272 (e.g., 0.1 μF) comprise a low pass filter with a corner frequency of 1/XR1·XC1 (e.g., 20 Hz), which corresponds to a time constant of XR1·XC1 (e.g., 50 ms). This filter is for rejection of large 50 Hz or 60 Hz noise. These "high" frequencies are effectively shorted to ground. It is particularly helpful when the towel dispenser proximity detector is powered from an AC-coupled supply. The ubiquitousness of the AC power frequency, however, makes this protection desirable, regardless.

The signal is next amplified by an operational amplifier XU1B 268, which has a gain of 22. The resistor XR5 277 serves as a feedback resistor to the negative (inverting) input terminal 279 of the operational amplifier 268. There is a ½ $XV_{DD}$ offset provided by the voltage divider network of XR3 274 and XR11 276. The output rests against the negative rail until a peak exceeds ½ $XV_{DD}$; The charge time adjustment XVR1 becomes a very simple and sensitive way to adjust to this threshold. A setting of 3 V between test points XTP1 278 and XTP2 280 is recommended. This adjustment is made with all external capacitive loads (i.e., plastic and metal components) in place.

Figure 10D:
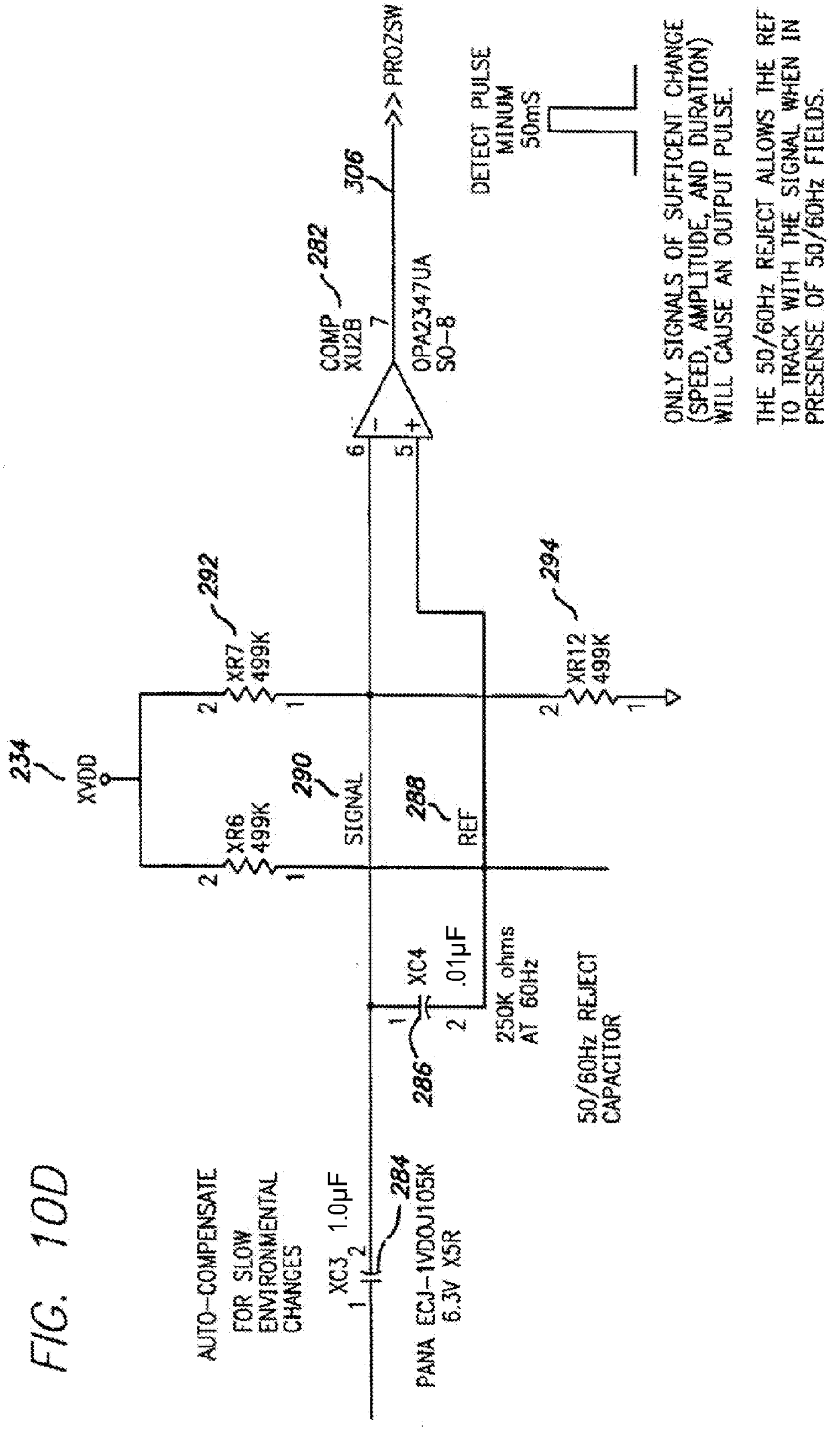
FIG. 10D shows the auto-compensate capacitor, the 50/60 Hz reject capacitor, and the output comparator which will produce an output pulse for signals which have passed all the rejection tests; these tests designed to prevent spurious signals from setting off an output pulse.
Figure 10E:
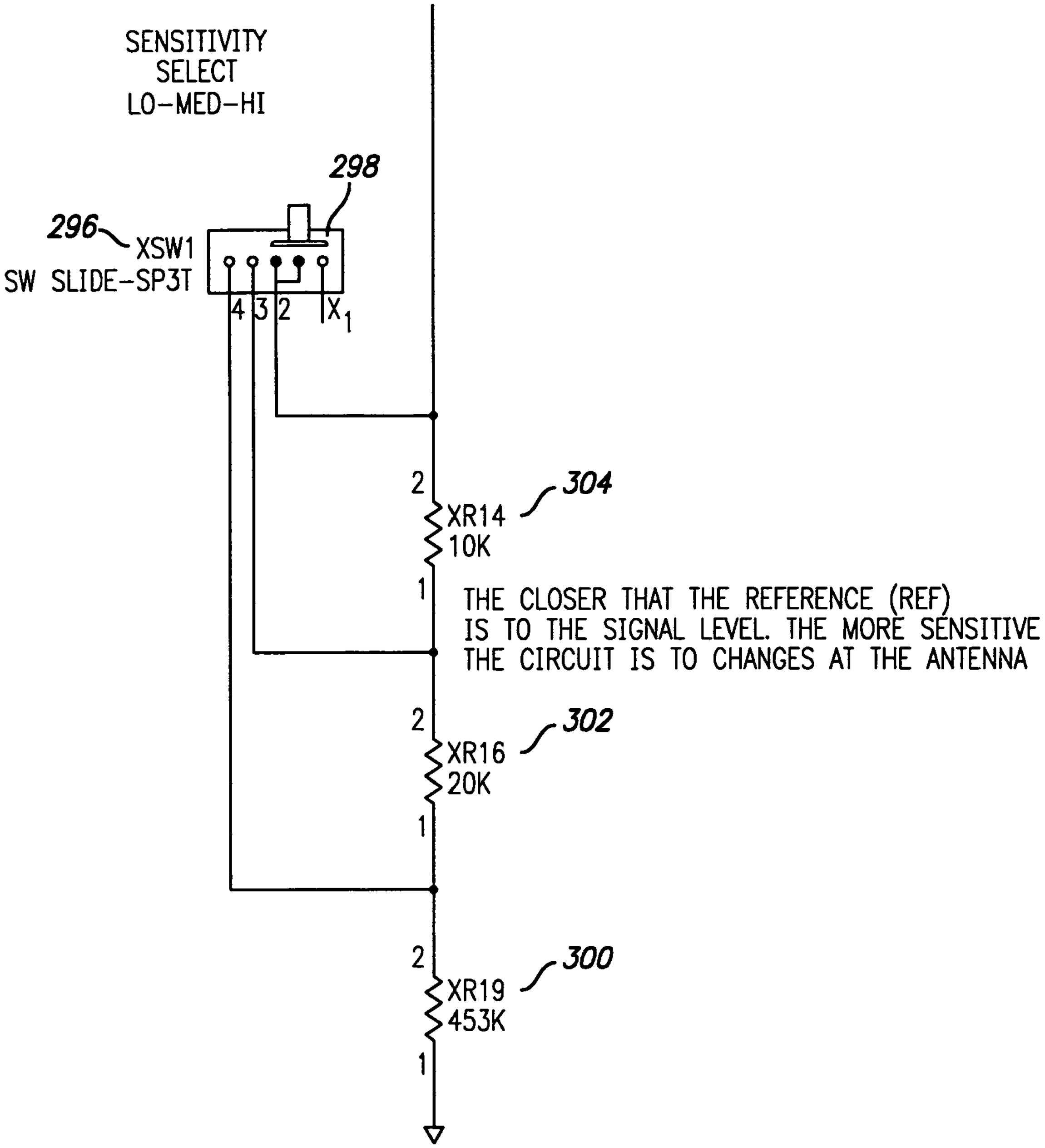
FIG. 10E shows a sensitivity select switch and circuit.

The output comparator 282 (FIG.10D) is connected to the signal processing from the operational amplifier 268 (FIG. 10C) by the auto-compensate capacitor XC3 284 (FIG. 10D). This makes the circuit insensitive to DC levels of signal, but sensitive to transients, e.g., a waving hand. As long as the charge-time adjustment function remains in a linear range, the sensitivity to a moving hand will be stable.

The capacitor XC4 286 allows the reference level (REF) 288 to track with approximately 50 Hz or 60 Hz noise on the SIGNAL 290 and not cause erroneous output pulses, since the AC noise will also track on the REF 288 (non-inverting) input to the comparator 282.

The output stage of the proximity detector is implemented as a variable threshold comparator, XU2B 282. The signal is set up with an offset voltage, where the resistors XR7 292 and XR12 294 are equal and divide the $V_{DD}$ voltage into two ½ $V_{DD}$ segments. Three sensitivity settings are provided by SW1 296, high, medium, and low. These settings include where the reference voltage is the voltage drop across XR6 298 (499 kΩ) with the remainder of the voltage divider equal to XR19 300 (453 kΩ) plus XR16 302 (20 kΩ) plus XR14 304 (10 kΩ). This is the high setting, since the base reference voltage ($V_{DD}$·499/[499+483] is greater than, but almost equal to the base signal value ($V_{DD}$·499/[499+499]. The signal must overcome, i.e., become smaller than the reference voltage (since the input is an inverting input), in order to swing the output 306 of the comparator XU2B 282 high and activate, say, a motor-control latch (not shown in FIG. 10D). The medium sensitivity setting, in FIG. 1E, of switch XSW1 296 (bypassing XR14, 304 10 kΩ, by way of switch XSW1 296) widens the difference between the signal and reference levels. The low sensitivity setting (bypassing XR14 304, 10 kΩ, and XR16 302, 20 kΩ, by way of switch XSW1 296), widens that difference between the signal and reference levels even more. Consequently, a larger difference between the signal and the reference voltage must be overcome to activate the motor by way of the comparator XU2B 282 and the motor-control latch (not shown in FIG. 10D).

The entire sensor circuit runs continuously on approximately 300 μA at a supply voltage ($XV_{DD}$ 234) of 5 V.

Although the present invention and its advantages have been described in detail, it should be understood that various changes, substitutions and alterations can be made herein without departing from the spirit and scope of the invention as defined by the appended claims.-Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A paper dispenser comprising:

a housing having an inner chamber adapted to support a roll of paper and having a dispensing aperture;

a motor adapted to dispense paper from the roll of paper through the dispensing aperture; and a proximity detection circuit for detecting the presence of a moving hand in the vicinity of said dispensing aperture, said circuit comprising:

an antenna with which is associated a fixed time constant determined by a predetermined capacitance and a predetermined resistance, as well as a variable time constant that is longer than the fixed time constant by an amount determined by an external capacitive load, said variable time constant being on the order of twice said fixed time constant when the external capacitive load is a hand of a person in proximity to the antenna;

an oscillator circuit for charging the antenna with an oscillating signal with a periodicity greater than said fixed time constant;

an operational amplifier being operated as a unity gain follower and receiving an antenna signal from the antenna, the antenna signal being representative of an external capacitive load on the antenna and having a periodic exponential waveform that has a longer time constant and a lower amplitude when said external capacitive load is in proximity to said antenna, the waveform of the antenna signal being thus representative of changes in the external capacitive load on the antenna;

a detector circuit electrically coupled to the operational amplifier for detecting changes in a low frequency component of the antenna signal and for generating a detection signal in response thereto; and a comparator responsive to the detection signal for generating an output signal to said motor when the detection signal is representative of a waving hand in proximity to the antenna.

2. The paper dispenser of claim 1, the proximity detection circuit further comprising at least one static protection circuit having at least one first diode adapted to conduct away from ground and at least one second diode adapted to conduct toward a supply voltage.

3. The paper dispenser of claim 1, the proximity detection circuit further comprising a voltage peak detector.

4. The paper dispenser of claim 1, the proximity detection circuit further comprising a low-pass filter electrically coupled between the detector circuit and the comparator for passing said low frequency signal component and rejecting a higher frequency noise component.

5. The paper dispenser of claim 4, the proximity detection circuit further comprising a gain and offset amplifier electrically coupled between the low-pass filter and the comparator, for amplifying said low frequency signal component.

6. The paper dispenser of claim 1, wherein the comparator is adapted to actuate the motor when the detection signal has a predetermined voltage level as compared to a reference voltage.

7. A paper dispenser comprising:

a housing having an inner chamber adapted to support a roll of paper and having a dispensing aperture;

a motor adapted to dispense paper from the roll of paper through the dispensing aperture; and a proximity detection circuit for detecting the presence of a moving hand, said circuit comprising:

an antenna with which is associated a fixed time constant determined by a predetermined capacitance and a predetermined resistance, as well as a variable time constant that is longer than the fixed time constant by an amount determined by an external capacitive load, said variable time constant being on the order of twice said fixed time constant when the external capacitive load is a hand of a person in proximity to the antenna;

means for charging the antenna with an oscillating signal with a periodicity greater than said fixed time constant;

means for buffering an antenna signal from the antenna, the antenna signal being representative of an external capacitive load on the antenna and having a periodic exponential waveform that has a longer time constant and a lower amplitude when said external capacitive load is in proximity to said antenna, the waveform of the buffered antenna signal being thus representative of changes in the external capacitive load on the antenna;

means for detecting changes in a low frequency component of the buffered antenna signal and for generating a detection signal in response thereto; and means for generating an output signal to said motor when the detection signal is representative of a waving hand in proximity to the antenna.

8. The paper dispenser of claim 7, the proximity detection circuit further comprising at least one static protection circuit having at least one first diode adapted to conduct away from ground and at least one second diode adapted to conduct toward a supply voltage.

9. The paper dispenser of claim 7, the proximity detection circuit further comprising means for filtering alternating current interference frequencies from the detection signal.

10. The paper dispenser of claim 7, the proximity detection circuit further comprising means for amplifying the detection signal.

11. The paper dispenser of claim 7, the proximity detection circuit further comprising means for detecting a voltage peak in the buffered antenna signal.

12. The paper dispenser of claim 7, wherein the output signal actuates the motor when the detection signal has a predetermined voltage level as compared to a reference voltage.

13. A paper dispenser comprising:

means for supporting a roll of paper within a housing;

means for dispensing paper from the roll of paper;

a proximity detector circuit comprising:

an antenna with which is associated a fixed time constant determined by a predetermined capacitance and a predetermined resistance, as well as a variable time constant that is longer than the fixed time constant by an amount determined by an external capacitive load, said variable time constant being on the order of twice said fixed time constant when the external capacitive load is a hand of a person in proximity to the antenna;

an oscillator circuit for charging the antenna with an oscillating signal with a periodicity greater than said fixed time constant;

an operational amplifier being operated as a unity gain follower and receiving an antenna signal from the antenna;

a detector circuit electrically coupled to the operational amplifier for detecting changes in a low frequency component of the antenna signal, the antenna signal being representative of an external capacitive load on the antenna and having a periodic exponential waveform that has a longer time constant and a lower amplitude when said external capacitive load is in proximity to said antenna, and for generating a detection signal in response thereto; and a comparator responsive to the detection signal for generating an output signal to said dispensing means when the detection signal is representative of a waving hand in proximity to the antenna.

14. The paper dispenser of claim 13, the proximity detection circuit further comprising at least one static protection circuit having at least one first diode adapted to conduct away from ground and at least one second diode adapted to conduct toward a supply voltage.

15. The paper dispenser of claim 13, wherein the output signal actuates the motor when the detection signal has a predetermined voltage level as compared to a reference voltage.

16. A paper dispenser comprising:

a housing having an inner chamber adapted to support a roll of paper and having a dispensing aperture;

a motor disposed within the housing and adapted to dispense paper from the roll of paper through the dispensing aperture; and a proximity detection circuit disposed within the housing, the proximity detection circuit comprising:

an antenna;

an asymmetric oscillator circuit electrically coupled to the antenna, the asymmetric oscillator circuit having an on-period and an off-period, wherein the asymmetric oscillator circuit is adapted to send an approximately uniform charge to the antenna during the on-period;

an antenna impedance buffer electrically coupled to the antenna, the antenna impedance buffer including an operational amplifier adapted to operate as a unity gain follower;

a voltage peak detector electrically coupled to an output of the antenna impedance buffer, the voltage peak detector comprising a diode, a current-limiting resistor, a peak storage capacitor, and a bleed off resistor, the diode and the peak storage capacitor being adapted to capture positive peaks of exponential waveforms from the antenna impedance buffer, the current limiting resistor being adapted to limit current flow from the antenna impedance buffer, and the bleed-off resistor being adapted to provide a discharge pathway for the peak storage capacitor, a gain and voltage offset amplifier electrically coupled to an output of the voltage peak detector, an output comparator adapted to receive an input signal from the gain and voltage offset amplifier and a reference voltage, the output comparator being further adapted to actuate the motor when the input signal has a predetermined voltage level as compared to the reference voltage, and an auto-compensation capacitor electrically coupled between the gain and voltage offset amplifier and the output comparator, the auto-compensation capacitor being adapted to filter out changes in DC voltage levels in the signal while allowing passage of transient portions of the signal representative of a waving hand in proximity to the antenna.

17. The paper dispenser of claim 16, the proximity detection circuit further comprising at least one static protection circuit having at least one second diode adapted to conduct away from ground and at least one third diode adapted to conduct toward a supply voltage.

18. The paper dispenser of claim 16, wherein the current limiting resistor is adapted to prevent oscillation at the antenna impedance buffer.

19. The paper dispenser of claim 16, the proximity detection circuit further comprising a low-pass filter electrically coupled between the voltage peak detector and the output comparator, the low-pass filter being adapted to filter out about 50 or about 60 Hz alternating current interference frequencies.

20. A method of dispensing paper comprising:

supporting a roll of paper within a housing, the housing including a dispensing aperture and having a motor affixed thereto;

affixing an antenna to the housing;

charging the antenna with an oscillating signal to thereby produce a periodic antenna signal, the antenna having an associated fixed time constant determined by a predetermined capacitance and a predetermined resistance, as well as a variable time constant that is longer than the fixed time constant by an amount determined by an external capacitive load, said variable time constant being on the order of twice said fixed time constant when the external capacitive load is a hand of a person in proximity to the antenna, said oscillating signal having a periodicity greater than said fixed time constant, detecting low frequency changes in the antenna signal representative of changes in said external capacitive load on the antenna caused by a moving hand in proximity to the antenna;

generating a low frequency detection signal component in response to said low frequency changes in the antenna signal;

selectively amplifying said low frequency detection signal component and rejecting a higher frequency noise component to thereby produce an amplified and filtered detection signal component;

compensating for slow environmental changes in the amplified and filtered detection signal component to thereby provide a compensated detection signal with increased sensitivity to transient signals representative of a waving hand in proximity to the antenna; and actuating the motor in response to the compensated detection signal, wherein the motor is adapted to dispense paper from the roll of paper through the dispensing aperture upon actuation.

21. The method of claim 20, wherein actuating the motor includes comparing the detection signal to a reference voltage.

22. The method of claim 20, wherein charging the antenna with the oscillating signal includes charging the antenna with an oscillating asymmetric signal.

23. The method of claim 20, wherein detecting changes in the antenna signal includes detecting a peak voltage.

24. The method of claim 20 further comprising providing protection from static utilizing at least one static protection circuit having at least one first diode adapted to conduct away from ground and at least one second diode adapted to conduct toward a supply voltages.

25. The method of claim 20 further comprising providing a current limiting resistor to prevent oscillation in the low frequency detection signal.

26. The method of claim 20 further comprising filtering out alternating current interference frequencies from the antenna signal.

27. The method of claim 20 further comprising wherein compensating for slow environmental changes includes filtering out changes in DC voltage levels from the detection signal component while passing transient portions thereof.

28. A method of dispensing paper comprising:

supporting a roll of paper within a housing, the housing including a dispensing aperture and having a motor affixed/d thereto;

producing an oscillating asymmetric signal having an on period and an off period;

charging an antenna with the oscillating asymmetric signal, the antenna being affixed to the housing, wherein the oscillating asymmetric signal is adapted to provide an approximately uniform amount of charge to the antenna during the on period;

discharging the antenna to a fixed voltage for every oscillation period;

buffering any impedance mismatch between the antenna and a peak detector utilizing an operational amplifier adapted to operate as a unity gain follower;

detecting a peak voltage in the antenna discharge with the peak detector;

offsetting and amplifying the detected peak voltage from the peak detector;

filtering out changes in DC voltage levels of the offset and amplified peak voltage while allowing passage of transient portions thereof; and actuating the motor upon detection in said transient portions of a signal which is within predetermined duration, amplitude, and rate of change criteria, wherein the motor is adapted to dispense paper from the roll of paper through the dispensing aperture upon actuation.

29. The method of claim 28, wherein detecting the peak voltage includes providing the peak detector with a diode and a peak storage capacitor, the diode and peak storage capacitor being adapted to capture peaks of exponential waveforms output from the operational amplifier.

30. The method of claim 28 further comprising providing protection from static utilizing at least one static protection circuit having at least one first diode adapted to conduct away from ground and at least one second diode adapted to conduct toward the supply voltage.

31. The method of claim 28 further comprising preventing oscillation by including a current limiting resistor at the output terminal of the operational amplifier.

32. The method of claim 28, wherein after detecting the peak voltage the method further comprises filtering out about 50 Hz and about 60 Hz alternating current interference frequencies through a low-pass filter.

33. The method of claim 28, wherein actuating the motor includes comparing the signal to a reference voltage to determine if the signal has a predetermined voltage level as compared to the reference voltage.

* * * * *